(12) United States Patent
Kasuga et al.

(10) Patent No.: US 9,036,064 B2
(45) Date of Patent: May 19, 2015

(54) SOLID-STATE IMAGING DEVICE INCLUDING A PHOTOELECTRIC CONVERTING FILM AND CAMERA SYSTEM USING THE SOLID-STATE IMAGING DEVICE

(71) Applicant: PANASONIC CORPORATION, Osaka (JP)

(72) Inventors: Shigetaka Kasuga, Osaka (JP); Motonori Ishii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/059,281

(22) Filed: Oct. 21, 2013

(65) Prior Publication Data

US 2014/0043510 A1 Feb. 13, 2014

Related U.S. Application Data

(63) Continuation of application No. PCT/JP2012/002632, filed on Apr. 16, 2012.

(30) Foreign Application Priority Data

Apr. 28, 2011 (JP) ................. 2011-102461

(51) Int. Cl.
*H04N 5/335* (2011.01)
*H04N 5/378* (2011.01)
(Continued)

(52) U.S. Cl.
CPC .......... *H04N 5/378* (2013.01); *H01L 27/14643* (2013.01); *H04N 5/3575* (2013.01); *H04N 5/363* (2013.01)

(58) Field of Classification Search
CPC .......................... H04N 5/378; H01L 27/14643
USPC ......................................................... 348/300
See application file for complete search history.

(56) References Cited

U.S. PATENT DOCUMENTS 4,363,963 A 12/1982 Ando
5,322,994 A * 6/1994 Uno ........................... 250/208.1
(Continued)

FOREIGN PATENT DOCUMENTS

JP 58-50030 11/1983
JP 05-207375 A 8/1993
JP 2002-148342 A 5/2002

OTHER PUBLICATIONS

Takada et al., "CMOS Image Sensor with Organic Photoconductive Layer Having Narrow Absorption Band and Proposal of Stack Type Solid-State Image Sensors," Research and Development Management Hedquarters, Fujii Photo Film Co., Ltd., SPIE-IS&T, vol. 6068, pp. 60680A-1 through 60680A-8.

(Continued)

*Primary Examiner* — Usman Khan
(74) *Attorney, Agent, or Firm* — McDermott Will & Emery LLP

(57) ABSTRACT

A solid-state imaging device in the present disclosure includes a semiconductor substrate, pixels, and column signal lines. Each of the pixels includes an amplifying transistor, a selection transistor, a reset transistor, and a photoelectric converting unit. The photoelectric converting unit includes a photoelectric converting film, a transparent electrode, a pixel electrode, and an accumulation diode. The pixel electrode and the accumulation diode are connected to a gate of the amplifying transistor. The amplifying transistor has a source connected to the column signal line and a drain connected to a power source line. The reset transistor has a source connected to the pixel electrode. The selective transistor is provided between the source of the amplifying transistor and the column signal line. A threshold voltage of the amplifying transistor is lower than a voltage of the accumulation diode.

11 Claims, 17 Drawing Sheets

(51) Int. Cl.
  *H01L 27/146* (2006.01)
  *H04N 5/357* (2011.01)
  *H04N 5/363* (2011.01)

(56) References Cited

U.S. PATENT DOCUMENTS

| 6,707,066 B2 | 3/2004 | Morishita | |
|---|---|---|---|
| 2002/0079493 A1* | 6/2002 | Morishita | 257/72 |
| 2004/0065840 A1 | 4/2004 | Morishita | |

OTHER PUBLICATIONS

Ihama et al., "CMOS Image Sensor with Stacked Organic Photoelectric Conversion Layers," Fujii Film Research & Development, No. 52-2007, English Abstract, 4 pgs.

International Search Report for International Application No. PCT/JP2012/002632 mailed May 22, 2012, with English translation, 2 pgs.

* cited by examiner

31: semiconductor substrate
41: gate electrode
42,43: gate electrode
45: photoelectric converting film
46: pixel electrode
47: transparent electrode
51-55: diffusion layer
113: amplifying transistor
115: selection transistor
117: reset transistor
125: power source line
126: feedback line
141: column signal line 45: photoelectric converting film
46: pixel electrode
47: transparent electrode

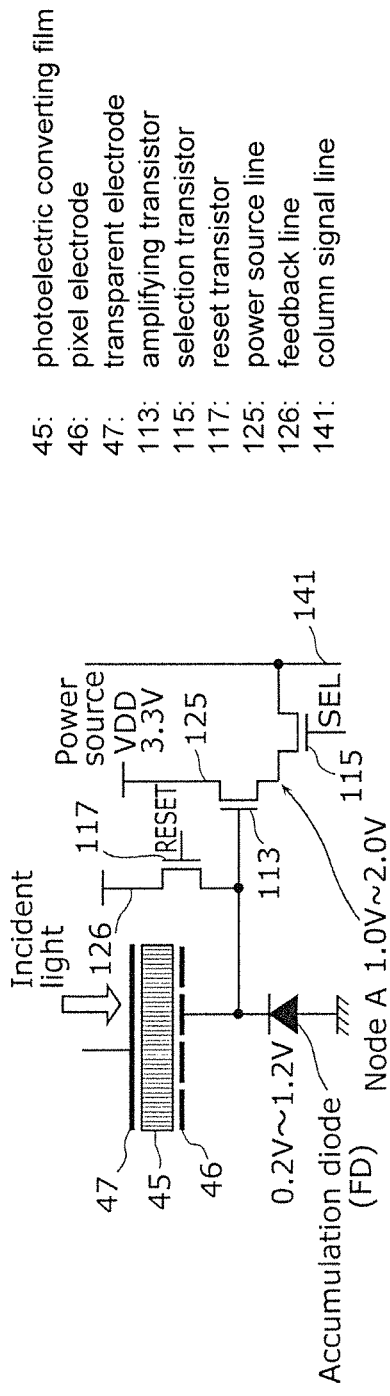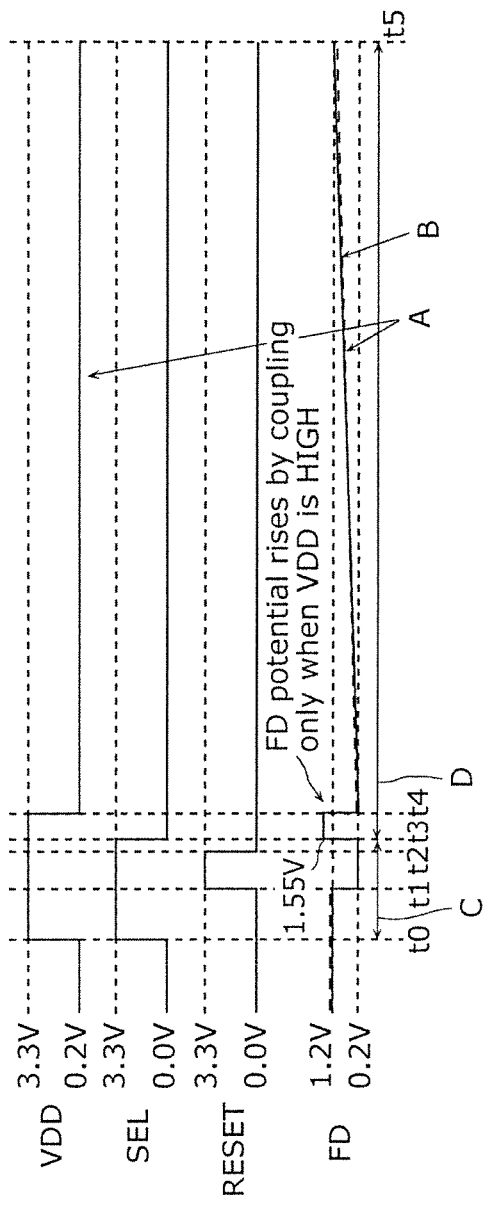
FIG. 4A
FIG. 4B
45: photoelectric converting film
46: pixel electrode
47: transparent electrode
113: amplifying transistor
115: selection transistor
117: reset transistor
125: power source line
126: feedback line
141: column signal line 501: reset noise voltage
502: feedback frequency band
503: area intersecting 501 and 502
504: an area where the reset noise is not reduced

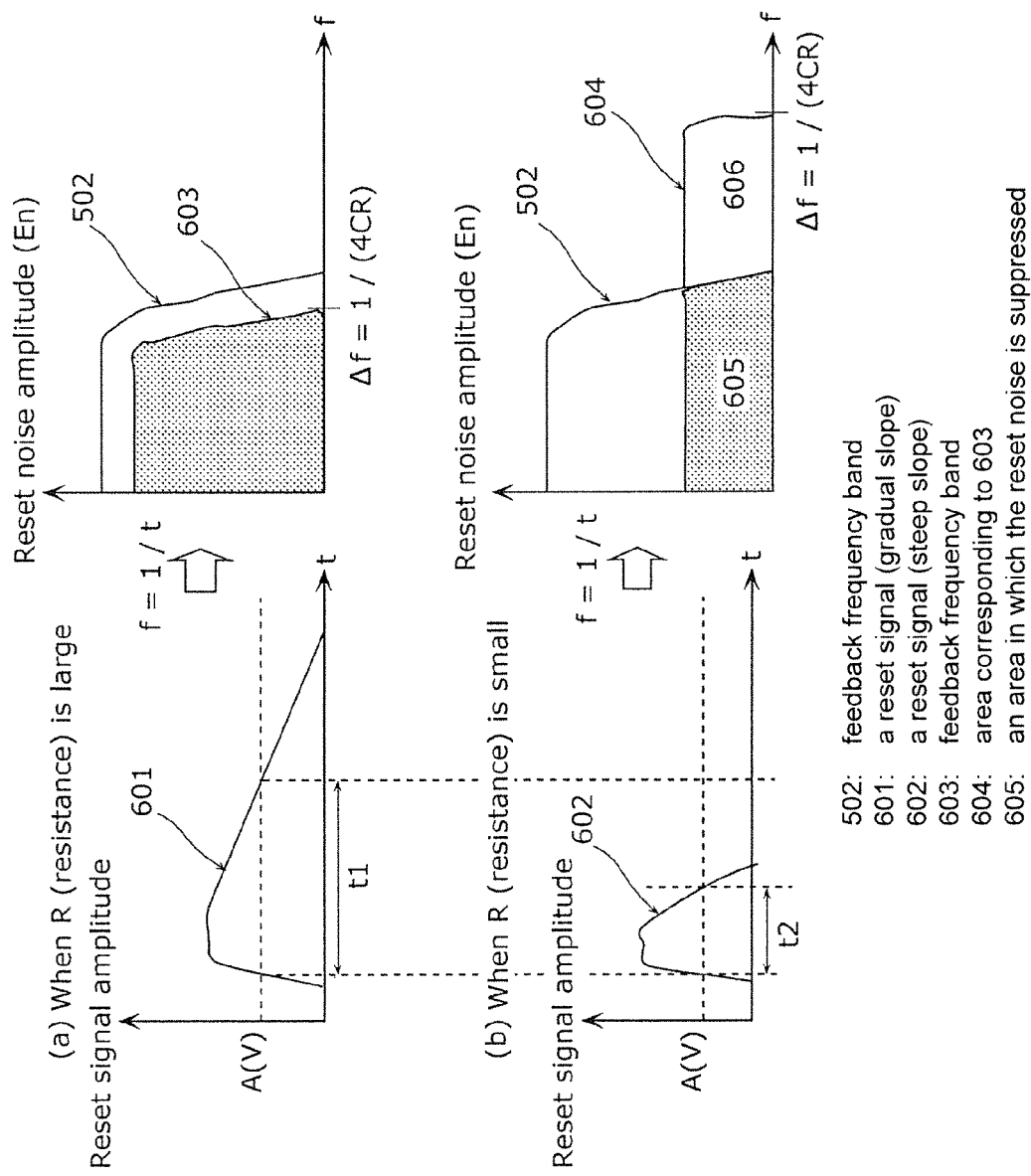

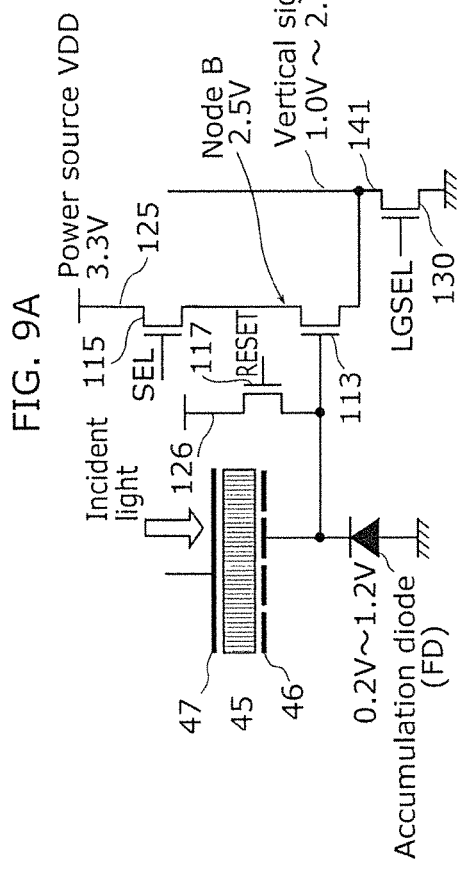
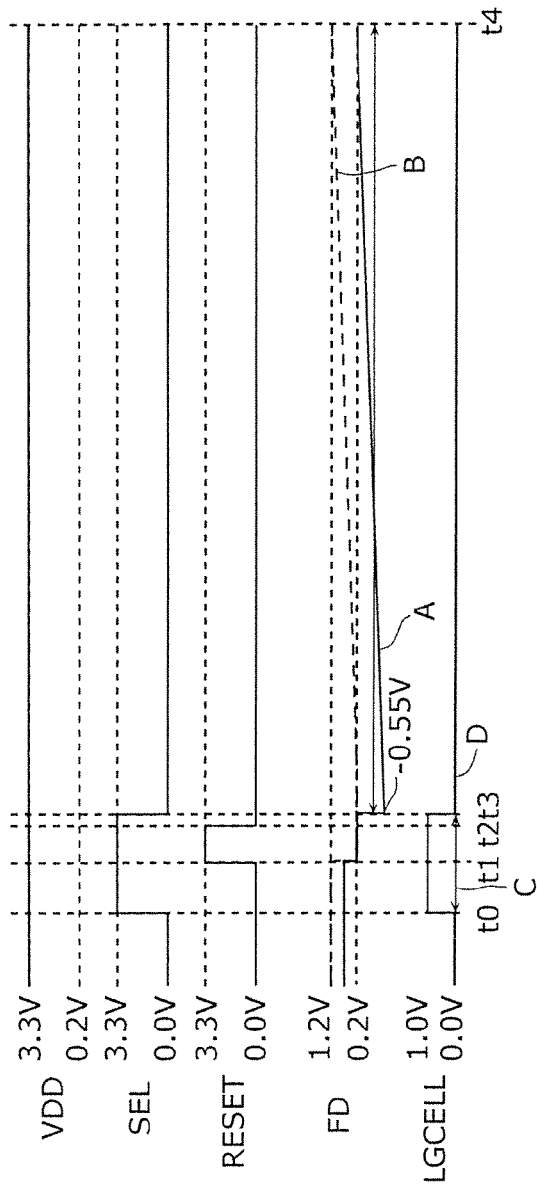
45: photoelectric converting film
46: pixel electrode
47: transparent electrode
113: amplifying transistor
115: selection transistor
117: reset transistor
125: power source line
126: feedback line
130: load transistor
141: column signal line
FIG. 9A
FIG. 9B

SOLID-STATE IMAGING DEVICE INCLUDING A PHOTOELECTRIC CONVERTING FILM AND CAMERA SYSTEM USING THE SOLID-STATE IMAGING DEVICE

CROSS REFERENCE TO RELATED APPLICATIONS

This is a continuation application of PCT International Application No. PCT/JP2012/002632 filed on Apr. 16, 2012, designating the United States of America, which is based on and claims priority of Japanese Patent Application No. 2011-102461 filed on Apr. 28, 2011. The entire disclosures of the above-identified applications, including the specifications, drawings and claims are incorporated herein by reference in their entirety.

FIELD

The present disclosure relates to solid-state imaging devices and, in particular, to a multi-layer solid-state imaging device.

BACKGROUND

Recent years have seen development of crystalline-silicon-based semiconductor substrates including photodiodes and rapid implementation of finer pixels for charge coupled device (CCD) solid-state imaging devices or metal oxide semiconductor (MOS) solid-state imaging devices respectively including CCDs or MOSes as scanning circuits. A pixel size of 3 μm around the year 2000 became smaller than or equal to 2 μm in 2007. The solid-state imaging devices to come to the market in 2010 will include pixels of 1.4 μm. If the pixel size becomes finer at this pace, the resulting pixel size is expected to be as small as 1 μm or smaller within several years.

In order to achieve the pixel size of 1 μm or smaller, however, the inventors of the present invention have found out that there are two problems to be solved: a first problem due to a small optical absorption coefficient of crystalline silicon and a second problem due to amount of signals to be used. Described hereinafter are the details of the first problem. An optical absorption coefficient of crystalline silicon depends on light wavelength. Crystalline silicon of approximately 3.5 μm in thickness is required to almost completely absorb and photoelectrically-convert green light of approximately 550 nm in wavelength which determines the sensitivity of a solid-state imaging device. Hence, a photodiode, which is formed in a semiconductor substrate and operates as a photoelectric converting unit, needs to be approximately 3.5 μm in depth. When the size of a flat pixel is 1 μm, it is very difficult to form a photodiode of approximately 3.5 μm in depth. If the depth of a formed diode is approximately 3.5 μm, a highly possible problem to occur would be that oblique incident light on the photodiode could enter another photodiode whose pixel is adjacent to the light-receiving photodiode. The oblique incident light on the adjacent pixel causes color mixture (cross talk), which develops a serous problem for color solid-state imaging devices. Photodiodes could be formed thinner in order to prevent the color mixture; however, a photodiode thinner than the above ones could deteriorate the optical absorption efficiency of green light, leading to deterioration in sensitivity of the image sensor. A finer pixel becomes smaller in its pixel size, followed by a decrease in sensitivity per pixel. The decreasing optical absorption efficiency in addition to the decreasing sensitivity is detrimental to color solid-state imaging devices.

Described next are the details of the second problem. The amount of signals to be used is determined depending on the saturation charge level of a pinned photodiode which is used for a typical solid-state imaging device. One of advantages of pinned photodiodes is that a pinned photodiode can achieve almost complete transfer of the signal charges accumulated therein to a charge detecting unit adjacent thereto (complete transfer). Consequently, very little noise occurs in charge transfer, and this feature allows the pinned photodiodes to be widely used for solid-state imaging devices. The pinned photodiodes, however, cannot have a large capacity per unit area per photodiode. Hence, making a pixel fine causes a problem of a decrease in saturation charge level. A compact digital camera requires saturation electrons of 10,000 per pixel. When the size of a pixel is approximately as small as 1.4 μm, the maximum number of the saturation electrons is not more than 5,000. Today, the decrease in the number of saturation electrons when an image is generated is addressed, using noise suppression by a digital signal processing technique; however, it is difficult for the technique to obtain a naturally reproduced image. Furthermore, a high-end single-lens reflex camera is said to require saturated electrons of approximately 30,000 per pixel.

It is noted that, for MOS image sensors including crystalline silicon substrates, one of the structures to be considered for the sensors is to send light to the rear surface of a substrate instead of the front surface which is planed and has a pixel circuit formed thereon. Unfortunately, the structure merely prevents wiring for the pixel circuit from blocking the incident light, and cannot solve the first and second problems.

A promising solution to the two problems is a multi-layer solid-state imaging device (See Patent Literature 1, for example). The multi-layer solid-state imaging device includes a semiconductor substrate on which a pixel circuit is formed, an insulating film provided on the substrate, and a photoelectric converting film formed on the insulating film. Hence, the photoelectric converting film may be made of a material having a large optical absorption coefficient, such as amorphous silicon. For example, amorphous silicon of approximately 0.4 nm in thickness can absorb most of green light having a wavelength of 550 nm. Moreover, the multi-layer solid-state imaging device does not include a pinned photo diode, which makes it possible for a photoelectric converting unit in the device to have a larger the capacity and a higher saturation charge level. Furthermore, the multi-layer solid-state imaging device does not completely transfer the charges, and extra capacity is allowed to be actively added. Hence, sufficiently enough capacity is implemented for a fine pixel, which successfully solves the second problem. The multi-layer solid-state imaging device may be formed in a structure of a stack cell in a dynamic random access memory.

CITATION LIST

Patent Literature

[PTL 1] Japanese Examined Patent Application Publication No. S58-050030

SUMMARY

Technical Problem

Suppose a case where the above multi-layer solid-state imaging device includes a pixel whose charge detecting circuit includes three transistors: namely, an amplifying transistor, a reset transistor, and a selection transistor.

In such a structure, when signal charges to be obtained by the stacked photoelectric converting film are electrons, the voltage of a capacitor (hereinafter referred to as an accumulation diode) connected to the photoelectric converting film goes lower with increasing amount of incident light; however, the initial voltage when no incident light is found is high. This causes a large difference between the voltages applied to the p-n junction of the accumulation diode, and tends to develop a dark current. The dark current appears visually obvious in a dark place with no incident light and in a poorly-illuminated place with dim incident light. Consequently, a noise component to a signal component increases and the signal-to-noise ratio (S/N) deteriorates.

Moreover, when holes are used as signal charges, a voltage of a reset drain line connected to a reset transistor needs to be set low. Hence, in a dark place with no incident light and in a poorly-illuminated place with dim incident light, the development of a dark current can be prevented compared with the case where electrons are used as the signal charges. The case, however, poses a problem of implementing a pixel circuit which is capable of correctly detecting signals from a low-voltage accumulation diode.

One non-limiting and exemplary embodiment provides a multi-layer solid-state imaging device capable of suppressing an increase in dark current and a camera system including the solid-state imaging device.

Solution to Problem

A solid-state imaging device according to an aspect of the present disclosure includes: a semiconductor substrate; pixels arranged on the semiconductor substrate in a matrix; and vertical signal lines each formed for a corresponding one of columns of the pixels, wherein each of the pixels includes an amplifying transistor, a selection transistor, a reset transistor, and a photoelectric converting unit, the photoelectric converting unit includes a photoelectric converting film formed above the semiconductor substrate, a transparent electrode formed above the photoelectric converting film, a pixel electrode formed below the photoelectric converting film, and an accumulation diode connected to the pixel electrode, the pixel electrode and the accumulation diode are connected to a gate of the amplifying transistor, the amplifying transistor has a source connected to the vertical signal line and a drain connected to a power source line, the reset transistor has a source connected to the pixel electrode, the selection transistor is provided one of (i) between the source of the amplifying transistor and the vertical signal line and (ii) between the drain of the amplifying transistor and the power source line, and a threshold voltage of the amplifying transistor is lower than a voltage of the accumulation diode.

According to the feature, the threshold voltage of the amplifying transistor is set lower than the potential of the accumulation diode so that a voltage to be applied to the p-n junction of the accumulation diode can be set lower. Consequently, a multi-layer solid-state imaging device employing the feature can reduce an increase in dark current.

The selective transistor may be provided between the source of the amplifying transistor and the vertical signal line, and the power source line may supply (i) a predetermined voltage during a period when the selection transistor is on, and (ii) a voltage lower than the predetermined voltage during a period when the selection transistor is off.

The feature makes it possible to reduce an increase in the voltage of the accumulation diode, which contributes to reducing an increase in dark current.

During a period when the reset transistor and the selection transistor are on, the voltage lower than the predetermined voltage may be lower than a voltage provided from the amplifying transistor to the vertical signal line.

The feature makes it possible to prevent an increase in the voltage of the accumulation diode, which contributes to further reducing an increase in dark current.

The solid-state imaging device may further include a load transistor provided between the vertical signal line and a fixed potential, wherein the selection transistor may be provided between the drain of the amplifying transistor and the power source line, and during a period when the selection transistor is off, the load transistor may be off and a voltage of the vertical signal line may be lower than a voltage of the drain of the amplifying transistor.

The feature makes it possible to reduce an increase in the voltage of the accumulation diode, which contributes to reducing an increase in dark current.

The fixed potential may be a negative potential.

The feature makes it possible to prevent an increase in the voltage of the accumulation diode, which contributes to further reducing an increase in dark current.

A camera system according to another aspect of the present disclosure includes the solid-state imaging device.

The feature makes it possible to implement a camera system providing high-quality images.

Advantageous Effects

The present disclosure makes it possible to detect signal charges to be obtained from stacked photoelectric converting films, using an accumulation diode having few dark currents. Such a feature contributes to reducing dark currents and defects, and therefore significantly improving image quality.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 4A shows in detail a circuit structure of the solid-state imaging device according to Embodiment 1.

FIG. 4B shows temporal changes in a row reset signal RESET, a row selection signal SEL, a potential of a power source line, and a potential of an FD when pixel signals of the solid-state imaging device according to Embodiment 1 are read out for one row.

FIG. 6 depicts a relationship between a band of a resistance R and reset noise En in a reset transistor of the solid-state imaging device according to Modification.

FIG. 9A shows in detail a circuit structure of a solid-state imaging device according to Embodiment 2.

FIG. 9B shows temporal changes in a row reset signal RESET, a row selection signal SEL, a driving signal LGCELL, a potential of a power source line, and a potential of an FD when pixel signals of the solid-state imaging device according to Embodiment 2 are read out for one row.

DESCRIPTION OF EMBODIMENTS

Embodiment 1

Figure 1:
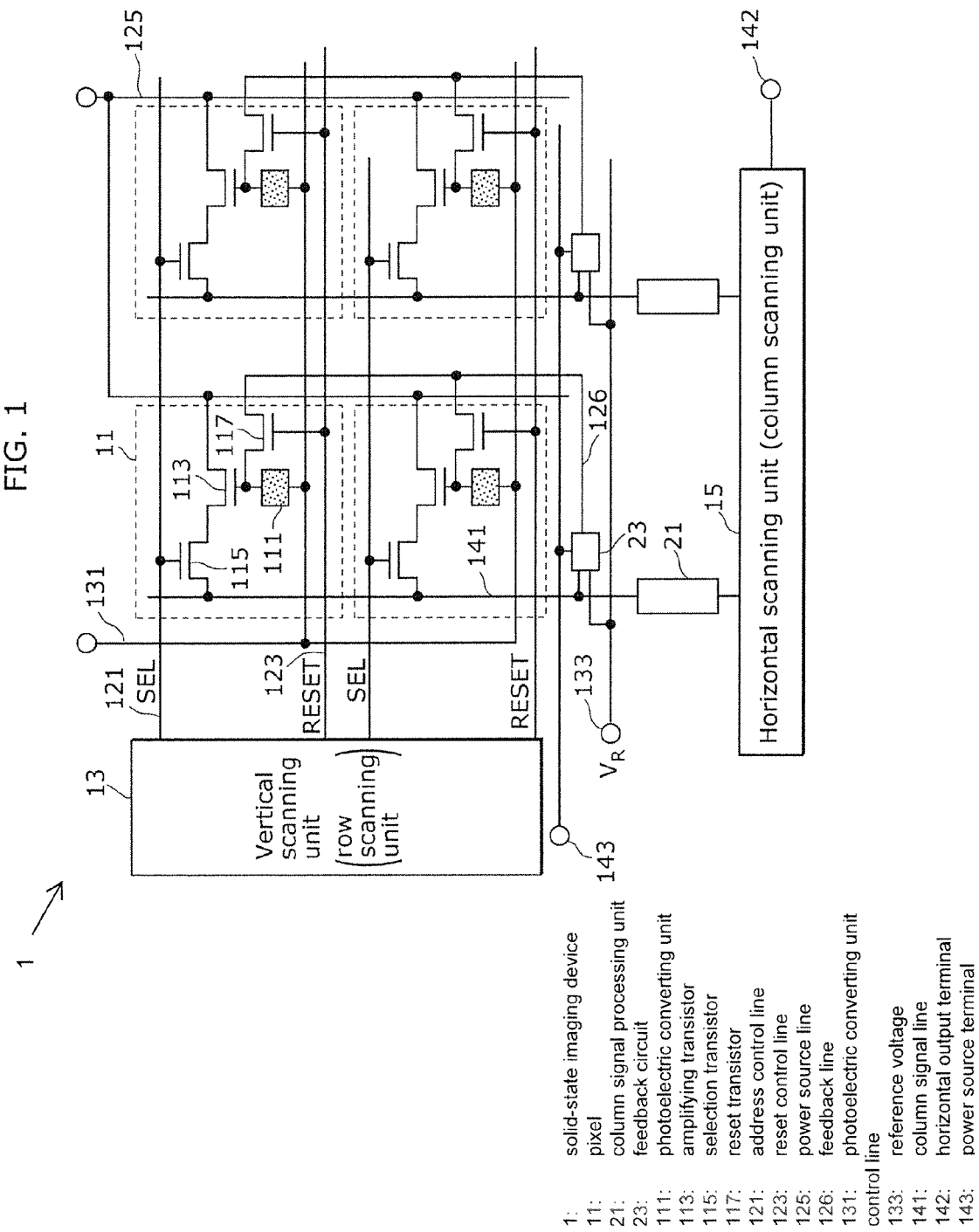
FIG. 1 schematically shows a structure of a multi-layer solid-state imaging device according to Embodiment 1.
Figure 2:
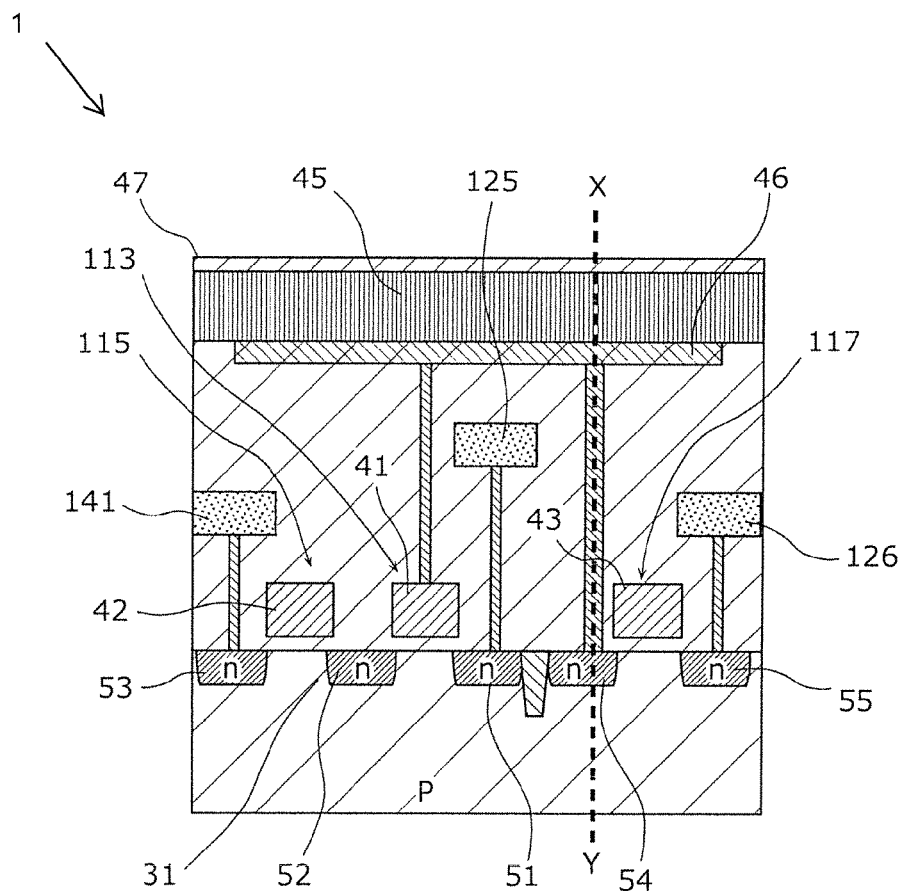
FIG. 2 depicts a cross-sectional view showing a structure of a pixel included in the solid-state imaging device according to Embodiment 1.

FIG. 1 schematically shows a structure of a multi-layer solid-state imaging device according to Embodiment 1, and FIG. 2 shows a structure of a pixel 11 in FIG. 1.

The solid-state imaging device 1 includes a semiconductor substrate 31 made of silicon, multiple pixels 11 arranged on the semiconductor substrate 31 in a matrix, a vertical scanning unit (also referred to as row scanning unit) 13 which supplies various timing signals to the pixels 11, a horizontal scanning unit (also referred to as column scanning unit and horizontal signal reading unit) 15 which sequentially reads signals out from the pixels 11 and provides the signals to a horizontal output terminal 142, column signal lines (vertical signal lines) 141 each formed for a corresponding one of columns of the pixels 11, feedback circuits (inverting amplifier) 23 connected to a power source terminal 143 and the column signal lines 141, column signal processing units 21 connected to the column signal lines 141, and feedback lines 126 each provided for one of the columns in order to feed back an output signal from the feedback circuit 23 corresponding to the feedback line 126 to the pixels 11 corresponding to the feedback circuit 23. It is noted that FIG. 1 shows as many pixels 11 as a set of two by two. Any given numbers of rows and columns of the pixels 11 may be provided.

Each of the pixels 11 includes a photoelectric converting unit 111, an amplifying transistor 113 having a gate connected to the photoelectric converting unit 111, a reset transistor 117 having a drain connected to the photoelectric converting unit 111, and a selection transistor 115 connected to the amplifying transistor 113 in series. The reset transistor 117 has the drain connected to a column signal line 141 via an inverting amplifier.

As shown in FIG. 2, the photoelectric converting unit 111 includes: a photoelectric converting film 45 which is formed above the semiconductor substrate 31, and made of a material such as amorphous silicon and converts incident light into electricity; a pixel electrode 46 which is formed under the photoelectric converting film 45—that is, the pixel electrode 46 formed on the rear surface of the photoelectric converting film 45 facing the semiconductor substrate 31—; a transparent electrode 47 which is formed over the photoelectric converting film 45—that is, the transparent electrode 47 is formed on the top surface of the photoelectric converting film 45 opposite the pixel electrode 46—; and an accumulation diode operating as a floating diffusion (FD) connected to the pixel electrode 46.

Formed in the semiconductor substrate 31 are the amplifying transistor 113, the selection transistor 115, and the reset transistor 117. The amplifying transistor 113 includes a gate electrode 41, a diffusion layer 51 operating as a drain, and a diffusion layer 52 operating as a source. The selection transistor 115 includes a gate electrode 42, the diffusion layer 52 operating as a drain, and a diffusion layer 53 operating as a source. The diffusion layer 52 operates in common as the source of the amplifying transistor 113 and the drain of the selection transistor 115. The reset transistor 117 includes a gate electrode 43, a diffusion layer 54 operating as a drain, and a diffusion layer 55 operating as a source. The diffusion layer 51 and the diffusion layer 54 are separated from each other via an element separation region 33.

Each of the amplifying transistor 113, the selection transistor 115, and the reset transistor 117 is an n-type MOS transistor.

On the semiconductor substrate 31, an insulating film 35 is formed to cover each of the transistors. Formed above the insulating film 35 is the photoelectric converting film 45. Through a contact 36, the pixel electrode 46 is connected to the gate electrode 41 of the amplifying transistor 113 and the diffusion layer 54 that is the source of the reset transistor 117. The diffusion layer 54 connected to the pixel electrode 46 operates as an accumulation diode. The accumulation diode is connected to the gate of the amplifying transistor 113. The selection transistor 115 is provided between the source of the amplifying transistor 113 and the column signal line 141.

The photoelectric converting unit 111 is connected between (i) the gate of the amplifying transistor 113 and the drain of the reset transistor 117 and (ii) a photoelectric converting unit control line 131. The amplifying transistor 113 has the gate connected to the pixel electrode 46, and provides a signal voltage, generated depending on a potential of the pixel electrode 46, to the column signal line 141 via the selection transistor 115. The reset transistor 117 has the source connected to the pixel electrode 46 and the drain connected to a corresponding one of the feedback lines 126. The gate of the selection transistor 115 is connected to the vertical scanning unit 13 via an address control line 121. The gate of the reset transistor 117 is connected to the vertical control unit 13 via a reset control line 123. The address control line 121 and the reset control line 123 are provided for each of the rows of the pixels 11. The amplifying transistor 113 has the drain connected to a power source line 125 and the source connected to the column signal line 141. In Embodiment 1, the reset transistor 117 is an n-type MOS transistor, and has the gate receive a reset signal including a positive reset pulse (upward displaced pulse). On and off actions of the selection transistors 115 and the reset transistors 117 are controlled by the vertical scanning unit 13 via the row reset signal RESET and the row selection signal SEL.

The photoelectric converting unit control line 131 is shared with all the pixels 11. Each of the column signal lines 141 is provided to a corresponding one of the columns of the pixels 11, and connected to the horizontal scanning unit 15. The column signal processing unit 21 performs operations including noise suppression signal processing such as correlated double sampling and analogue-to-digital conversion.

Moreover, a column signal line 141 provided for each of the columns has a feedback circuit 23 connected thereto. The feedback circuit 23 receives through a reference voltage terminal 113 a reference voltage (VR) 133 in common with all the pixels. The feedback circuit 23 has the output connected to the source of the reset transistor 117. When a selection transistor 115 and a reset transistor are conductive, the feedback circuit 23 receives an output from the selection transistor 115 and performs a feedback operation so that the gate potential of the amplifying transistor 113 becomes constant. Here, the output of the feedback circuit 23 is 0V or a positive voltage near 0V.

Figure 3A:
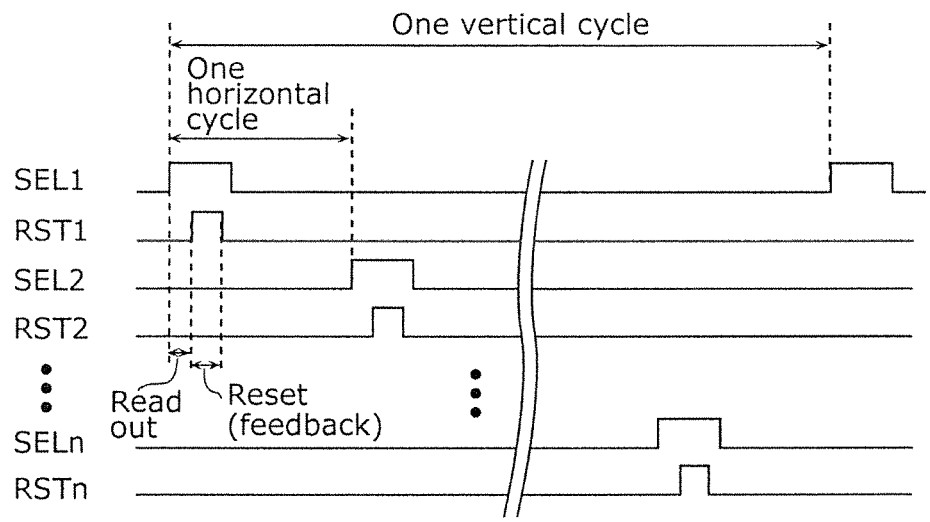
FIG. 3A depicts a timing diagram showing the most basic imaging operation of the solid-state imaging device according to Embodiment 1.

FIG. 3A depicts a timing diagram showing the most basic imaging operation of the solid-state imaging device according to Embodiment 1. It is noted that SEL 1 in FIG. 3A shows a row selection signal (a signal to be supplied via the address control line 121) on the first row. RST 1 shows a row reset signal (a signal supplied via the reset control line 123) on the first row. Both SEL 2 and RST 2 are similar to the above signals except that SES 2 and RST 2 correspond to a different row. One horizontal cycle represents a period which lasts from when a row selection signal becomes effective to when another row selection signal on the subsequent row becomes effective (from the rise of SEL 1 to the rise of SEL 2), and is required to read out signal voltages from the pixels 11 for one row. One vertical cycle represents a period required to read out signal voltages from the pixels 11 on all the rows.

The feedback operation is performed when the row selection signal and the row reset signal become simultaneously valid. In other words, the feedback operation is performed when the selection transistor 115 and the reset transistor 117 are simultaneously on. The vertical scanning unit 13 causes the selection transistor 115 and the reset transistor 117 to reset (perform the feed back operation) the pixels 11 after the signals are read out from the pixels 11. First, the vertical scanning unit 13 supplies a valid row selection signal to the gate of the selective transistor 115 to provide an output signal of the amplifying transistor 113 to the column signal line 141. The vertical scanning unit 13 next supplies a valid row reset signal after a predetermined time period since the valid row selection signal was supplied. Hence, the vertical scanning unit 13 feedbacks the output of the feedback circuit 23 to the pixel electrode 46 via the reset transistor 117.

The feedback operation will suppress reset noise generated when the reset transistor 117 resets a signal charge, and less reset noise will be superimposed to the subsequent signal charge. This contributes to reducing random noise.

Figure 3B:
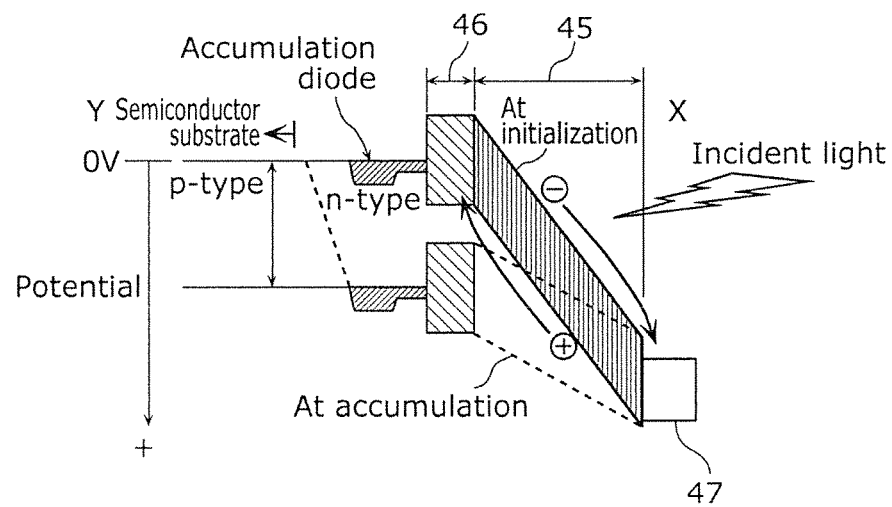
FIG. 3B shows a potential (a potential taken from the line X-Y in FIG. 2) of a pixel included in the solid-state imaging device according to Embodiment 1.

FIG. 3B shows a potential taken from the line X-Y in FIG. 2.

First, when no signal is observed (the signal charge is reset), the potential of the diffusion layer 54 that operates as an accumulation diode is almost 0V with a slight backward bias applied thereto. When the backward bias of approximately 25 mV is caused by thermal noise, part of the charges in the accumulation diode could travel to the substrate. Hence, an exemplary backward bias to be applied while the signal charges are being accumulated may be greater than or equal to approximately 0.1 V. Setting the potential of the accumulation diode to approximately 0V makes it possible to reduce an opposite-direction leak current (dark current) flowing between the accumulation diode and the semiconductor substrate 31. In contrast, a positive voltage is applied to the transparent electrode 47. Incident light above the transparent electrode 47 passes through the transparent electrode 47 and enters the photoelectric converting film 45. The photoelectric converting film 45 converts the incident light into electron-hole pairs. The electrons of the converted electron-hole pair are transferred to the transparent electrode 47, and flows to a power source (not shown) connected to the transparent electrode 47. The holes are transferred to and accumulated in the diffusion layer 54 as signal charges. Hence, the potential of the diffusion layer 54 changes positive, and a voltage is applied between the diffusion layer 54 and the semiconductor substrate 31. This causes the opposite-direction leak current (dark current) flowing between the diffusion layer 54 and the semiconductor substrate 31, and the opposite-direction leak current is observed as noise. However, this is not a problem since the noise does not appear obvious when there is a signal.

The voltage that has changed positive by the holes accumulated in the diffusion layer 54 is transferred to the gate electrode 41 of the amplifying transistor 113. A signal which has been amplified by the amplifying transistor 113 is provided to the column signal line 141 via the selection transistor 115.

In order to accumulate electrons having negative charges in the diffusion layer of a typical solid-state imaging device, a reset signal having a large amplitude needs to be applied to the gate of the reset transistor 117. The feature shown FIG. 3B for reading out signals, however, allows holes having positive charges to be accumulated in the diffusion layer 54. This feature allows a reset signal having a small amplitude to be applied to the gate of the reset transistor 117.

FIG. 4A shows in detail a circuit structure of the solid-state imaging device in FIG. 1. FIG. 4B shows temporal changes in the row reset signal RESET and the row selection signal SEL provided to the pixels 11, the potential VDD of the power source line 125 (the potential of the drain of the amplifying transistor 113), and the potential of an FD (accumulation diode) when pixel signals of the solid-state imaging device according to Embodiment 1 are read out for one row. In FIG. 4A, the amplifying transistor 113 operates as a source follower circuit (hereinafter referred to as SF circuit). It is noted that in FIG. 4B, the period between the time t0 and t4 is a charge read-out period for reading pixel signals (accumulated charges) out to the column signal lines 141, and the period between the time t4 and t5 is a charge accumulating period for accumulating the charges in the photoelectric converting unit 111. Here, the charge accumulating period varies depending on an operation of an electronic shutter and a frame rate. Furthermore, A to D in FIG. 4B denote the following: A denotes, "VDD is dropped as low as or lower than the voltage of node A so that the FD potential that has risen by coupling is dropped back to the original", B denotes, "The change in VD potential when charges are ideally accumulated", C denotes, "The SF is operating during the charge read-out period, and a gate capacitance of the amplifying transistor does not affect its operation", and D denotes, "The SF is not operating during the charge accumulating period, and a gate capacitance of the amplifying transistor affects its operation. No rise in FD potential due to coupling is observed, and a dark current is successfully reduced".

As described before, the dark current, which is a cause of deterioration in image quality, increases with an increasing difference between the voltages applied to the p-n junction of an accumulation diode. In FIG. 4B, when the reset transistor 117 turns on and the n-type diffusion layer (the diffusion layer 54) of the accumulation diode connected to the pixel electrode 46 is initialized to a reset drain voltage (the potential of the feedback line 126), the reset drain voltage is set to a voltage of an approximately GND level (0.2 V in FIG. 4B). Since the p-type diffusion layer (semiconductor substrate 31) of the p-n junction of the accumulation diode is usually connected to GND level, this setting avoids creating a large voltage difference in the initialization. Hence, the dark current of the accumulation diode can be made smaller, and noise and white defects in a dark place and a poorly-illuminated place do not look obvious. The amplifying transistor 113 to detect variation in potential of the accumulation diode has to operate in response to a voltage which varies from the GND level of the reset drain voltage. Hence, the threshold voltage of an n-type MOS transistor to be used for the amplifying transistor 113 is lower than a voltage (potential of the accumulation diode) of the p-n junction of the accumulation diode in the charge read-out period and the charge accumulating period.

The solid-state imaging device according to Embodiment 1 utilizes a photoelectric converting unit having a large optical absorption coefficient, and shows excellent quantization efficiency. Consequently, the device is highly effective when random noise is low.

Moreover, the solid-state imaging device according to Embodiment 1 needs a smaller area for the photoelectric converting unit, and can obtain a greater conversion gain for a circuit. Consequently, the device is highly effective when random noise is low. Furthermore, in its structure, the solid-state imaging device does not perform photoelectric conversion in the semiconductor substrate. Consequently, the device is highly effective when random noise is suppressed.

In addition, the solid-state imaging device causes an inverting amplifier provided on each of the column signal lines to perform a feedback operation, so that reset noise of a multi-layer solid-state imaging device can be suppressed and fewer signal charges on which the reset noise is superimposed need to be read out. Consequently, the device can reduce random noise.

Modification

The solid-state imaging device according to Embodiment 1 utilizes a photoconductive film multi-layered sensor to suppress reset noise. There is another technique to further reduce the reset noise. The reset noise in Embodiment 1 is referred to as kTC noise, and the voltage of the noise is represented as shown in Expression 1 below.

$$En2=kT/C$$

$$En=\sqrt{(kT/C)}=\sqrt{(4kTR\Delta f)} \qquad \text{(Expression 1)}$$

Figure 5A:
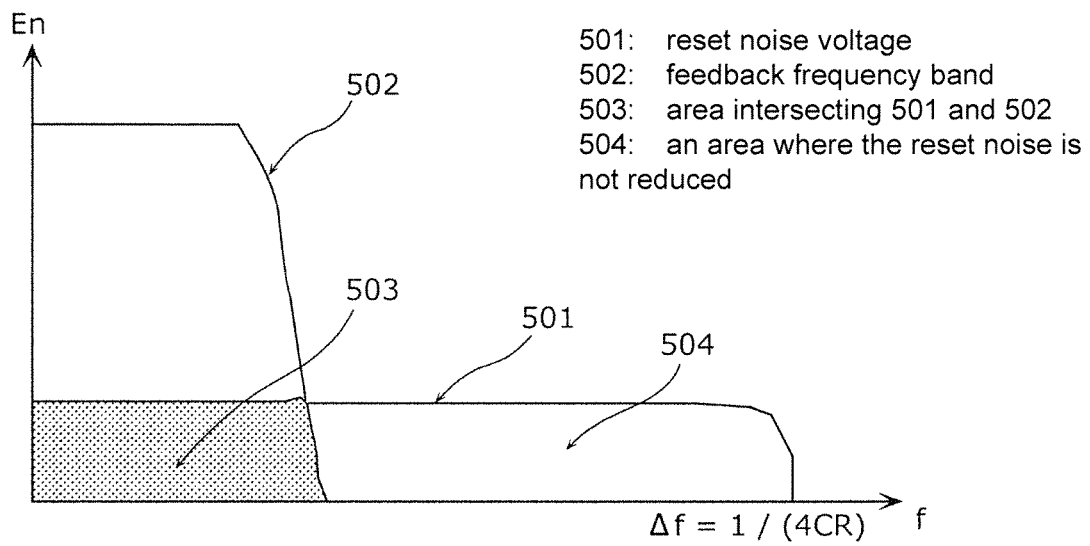
FIG. 5A shows reset noise En to a reset frequency f in a solid-state imaging device according to Modification of Embodiment 1.

Here, k is a Boltzmann constant, T is an absolute temperature (k), R is a resistance (Ω) of the reset transistor 117, C is a parasitic capacitance (F) of the reset transistor 117, Δf is a reset frequency (Hz) of the reset transistor 117. When 4kTR is a constant, Expression 1 shows that the voltage (En) of the reset noise generated by the reset transistor 117 is limited by the bandwidth (Δf) of the reset frequency of the reset transistor 117 (in other words, En decreases with decreasing Δf). Here, the reset frequency is mainly a frequency component included in the trailing edge of a pulse included in a row reset signal. FIG. 5A shows reset the noise En to the reset frequency f.

501 shows a reset noise voltage (En) observed when the reset frequency of the reset transistor 117 is shown on the axis of abscissas. 502 shows a feedback frequency band of the feedback circuit 23. 503 within intersecting 501 and 502 is an area in which the reset noise can be suppressed. 504 is an area in which the reset noise cannot be reduced.

Here, based on Expression 1, a bandwidth (Δf) for the reset frequency of the reset transistor 117 is represented as Expression 2 below.

$$\Delta f=1/(4CR) \qquad \text{(Expression 2)}$$

The bandwidth (Δf) for the reset frequency of the reset transistor 117 can be expressed as a time constant 1/CR based on Expression 2, and the parasitic capacitance C of the reset transistor 117 is negligible since the parasitic capacitance C can be reduced in Embodiment 1. Here, the bandwidth (Δf) for the reset frequency of the reset transistor 117 is limited by the resistance R of the reset transistor 117.

In other words, Δf becomes smaller as the resistance R becomes greater, which means that the frequency f is slow (low frequency). The resistance R of the reset transistor 117 represents "difficulty in conductivity", and can be replaced with the bandwidth of a reset signal applied to the gate of the reset transistor 117 (more time is required for resetting as the resistance R is greater).

Figure 5B:
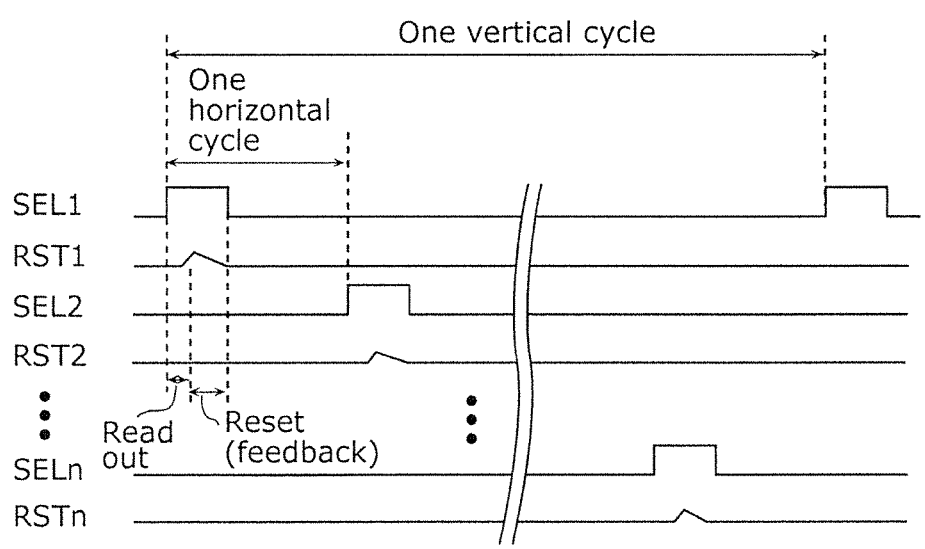
FIG. 5B depicts a timing diagram showing a basic imaging operation of the solid-state imaging device according to Modification.

FIG. 5B depicts a timing diagram showing a basic imaging operation of the solid-state imaging device according to Modification. FIG. 5B differs from FIG. 3A in that FIG. 5B shows a slope on the falling edge of a reset pulse of the row reset signal. It is noted that FIG. 5B also shows a slope on the rising edge of a reset pulse. FIG. 5B is the same as FIG. 3A in that the reset pulses having the sloped edges have small amplitudes.

Hence, the falling edge of a row reset signal slopes. In other words, compared with a suddenly falling edge, the falling edge in FIG. 5B includes a frequency component having a narrower band. Such a feature can reduce occurrence of random noise due to a falling edge. Moreover, since the amplitude of a row reset signal is small and the edge slopes, the reset transistor 117 operates as a switch whose resistance continuously changes from on to off, instead of a simple switch having the two states of on and off.

FIG. 6 depicts a relationship between the band of the resistance R and the reset noise En in the reset transistor 117. In the case of (a) where the resistance R of the reset transistor 117 is large when the time t on the axis of abscissas, a reset signal applied to the gate of the reset transistor 117 appears in a gradual slope as shown in 601 and the high (A volt) period for the reset signal is represented as t1. In contrast, in the case of (b) where the resistance R of the reset transistor 117 is small, a reset signal applied to the gate of the reset transistor 117 appears in a steep slope as shown in 602 and the high (A volt) period for the reset signal is represented as t2.

In the case of (a) where the resistance R of the reset transistor 117 is large when the frequency f is shown on the axis of abscissas also as seen in FIG. 5A, the reset noise (En) is highly likely to be included in the feedback frequency band (502) of the feedback circuit 23 as seen in 603 and the reset noise is likely to be suppressed by the feedback circuit according to Embodiment 1. In the case of (b) where the resistance R of the reset transistor 117 is small, a band (606) of the reset noise (En) is highly likely to be excluded from the feedback frequency band (502) of the feedback circuit 23 and the reset noise cannot be easily reduced. It is noted that 605 represents an area in which the reset noise is suppressed, and 603 is as large as 604.

In other words, in the case where the reset band for a reset signal to be provided to the gate of the reset transistor 117 is made long as t1, which is longer than t2, FIG. 6 shows that the reset noise generated by the reset transistor 117 can be suppressed.

Figure 7:
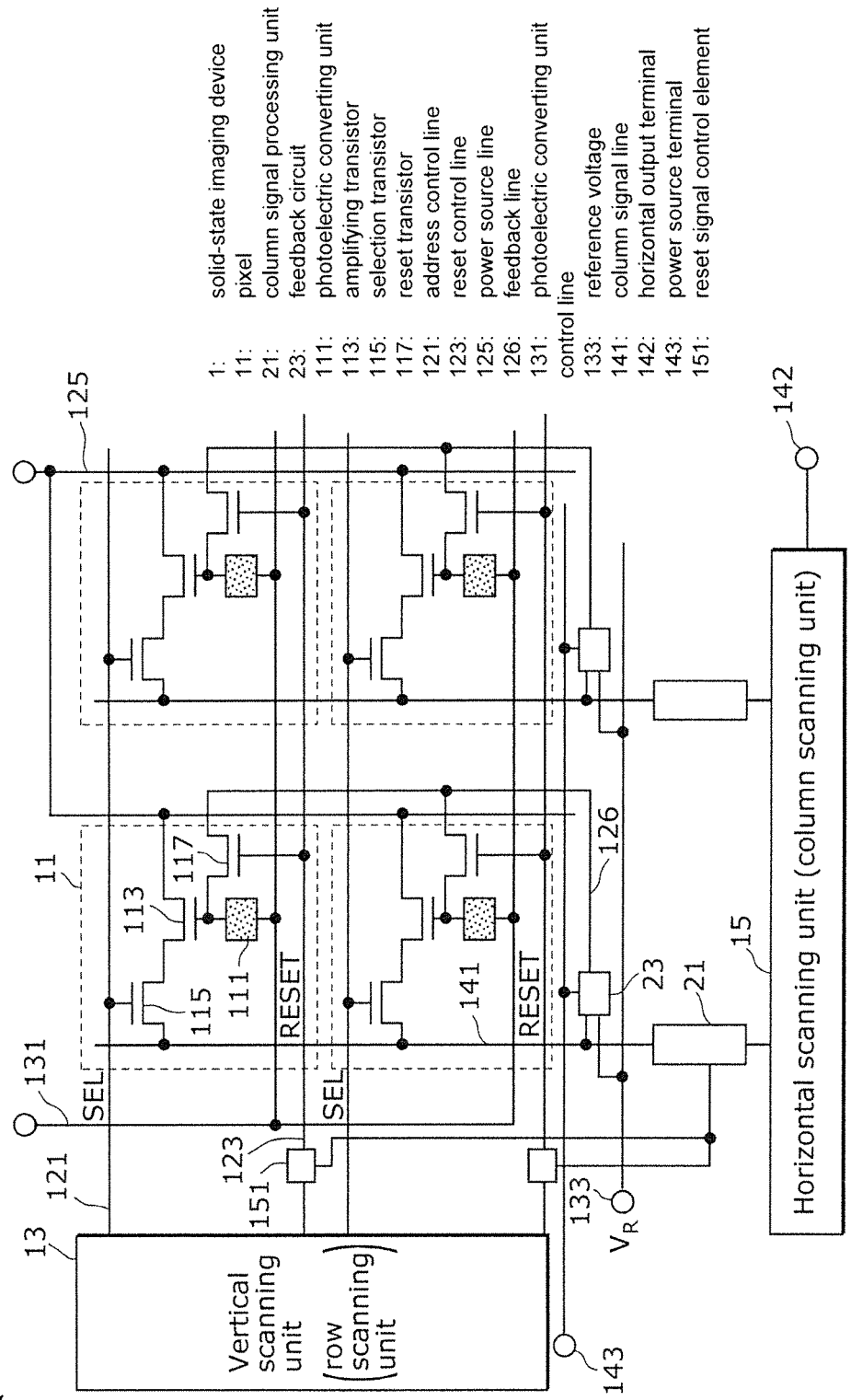
FIG. 7 shows an overall structure of the solid-state imaging device according to Modification.

FIG. 7 shows an overall structure of the solid-state imaging device according to Modification.

The solid-state imaging device 1A in FIG. 7 is different from the solid-state imaging device 1 in FIG. 1 according to Embodiment 1 in that the former solid-state imaging device additionally includes a reset signal control element 151.

The reset signal control element 151 is a waveform adjusting unit for adjusting the waveform of a row reset signal to be applied to the gate of the reset transistor 117. The reset signal control element (waveform adjusting unit) 151 adjusts a waveform so that a slope is provided to a falling edge of a reset pulse included in a row reset signal, and supplies the row reset signal to the gate of the reset transistor 117. In other words, the reset signal control element (waveform adjusting unit) 151 adjusts the frequency band of the falling edge included in the row reset signal.

Comparative Example

In an example of Embodiment 1, the amplifying transistor 113 performs a circuit operation as a source follower during the charge read-out period in which the potential of an accumulation diode is detected, and the potential of the accumulation diode is uninfluenced during the period. While the potential of the accumulation diode is not detected, however, the potential is significantly influenced by the source and the drain of the amplifying transistor 113. The principle of the influence is described in the driving shown in FIGS. 8A and 8B. For the sake of simplicity in the description, holes are to be used as signal charges hereinafter.

Figure 8A:
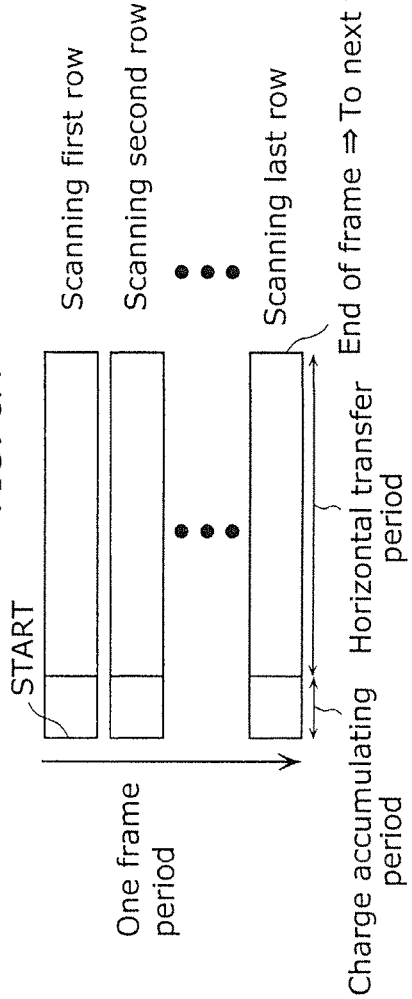
FIG. 8A shows how a solid-state imaging device in a comparative example according to Embodiment 1 reads out pixel signals for one frame.
Figure 8B:
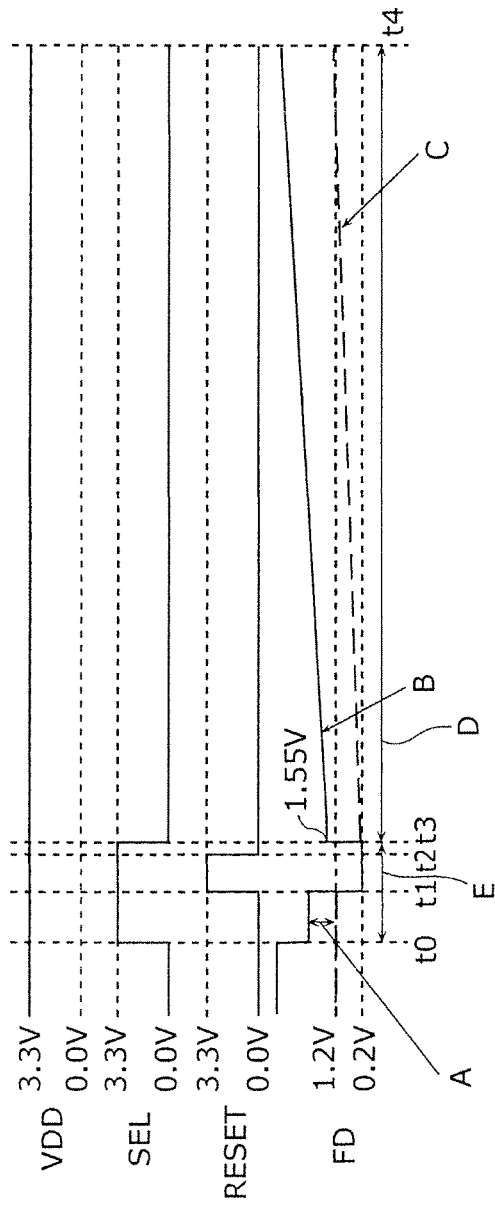
FIG. 8B shows temporal changes in a row reset signal RESET, a row selection signal SEL, a potential of a power source line, and a potential of an FD when pixel signals of the solid-state imaging device according to the comparative example are read out for one row.

FIG. 8A shows how to read out pixel signals for one frame. FIG. 8B shows temporal changes in a row reset signal RESET and a row selection signal SEL provided to the pixels 11, the potential VDD of the power source line 125, and a potential of an FD, when pixel signals are read out for one row. It is noted that in FIG. 8B, the period from the time t0 to t3 is a charge read-out period, and the period from the time t3 to t4 is a charge accumulating period. The structure of a pixel which performs the driving in FIGS. 8A and 8B is the same as the structure shown in FIG. 4A; however, the structures of the amplifying transistors 113 differ from each other. In FIG. 8B, A denotes, "The voltage ΔV is caused by a dark current of an FD", B denotes, "Change in FD potential when coupling occurs (the slope is steeper for the dark current than that of an ideal slope)", C denotes, "An ideal change in FD potential", D denotes, "The gate capacitance of the amplifying transistor influences the operation since the SF is not operating in the charge accumulating period. The FD potential rises due to coupling and the dark current increases", and E denotes, "The SF is operating in the charge accumulating period, and the gate capacitance of the amplifying transistor does not influence the operation".

At the time t0, the row selection signal SEL is set high, the selection transistor 115 turns on, and the potential of the FD, which is raised by accumulated charges, is read out to the column signal line 141.

At the time t1, the row reset signal RESET is set high, the reset transistor 117 turns on, and the FD potential set on the feedback line 126 is read out to the column signal line 141. The column signal line 141 is connected to a correlated double sampling circuit (CDS). The CDS obtains the difference between the potentials of the two FDs (the FD potential raised by accumulated charges and the FD potential set on the feedback line 126), and outputs the difference outside. Until here, the SF circuit is under the operating state.

At the time t2, the row reset signal RESET is set low, the reset transistor 117 is turned off. At time t3, the row selection signal SEL is set low and the selection transistor 115 is turned off. Hence, the SF circuit goes into the non-operating state, and the FD potential shifts from the potential previously set on the feedback line 126 to a higher potential. This is because the threshold voltage of the amplifying transistor 113 is low.

After the time t3, the SF circuit is under the non-operating state. Since the threshold voltage of the amplifying transistor 113 is low, the drain and the source of the amplifying transistor 113 become conductive. Because of the conductivity, the gate potential of the amplifying transistor 113 further rises by coupling and the source is filled with the power source voltage VDD at the drain. Accordingly, the potential of the FD connected to the gate of the amplifying transistor 113 rises. The rising voltage appears as a divided voltage of the capacitance of the gate of the amplifying transistor 113 and the capacitance of the FD. Assumed in FIG. 8B is the case where the capacitance of the gate is the same as the capacitance of the FD. Here, the voltage rises by 1.55 V—that is the half of 3.1 V that is the difference obtained by subtracting the voltage of 0.2 V on the reset drain line from the power source voltage of 3.3 V. Here, the initial potential of the FD is 1.75 V, and the intensity of an electric filed to the FD increases. Hence, a dark current tends to occur. Consequently, the slope of the potential of the FD in the charge accumulating period between the time t3 and the time t4 in FIG. 8B appears steeper for an increase in dark current than an ideal slope. When the time goes back to the time t0, the potential of the FD is released from a floating state since the SF circuit operates; however, the potential is higher by ΔV than the ideal potential of the FD. This is the component of the dark current. Since the dark current occurs in a different manner for each pixel, the dark current facilitates unevenness of sensitivity and becomes a signal component which also differs from the potential observed when the FD is initialized. Hence, the dark current appears in the dark as a varying signal, which results in deterioration in image quality.

In the driving in FIG. 4B, on the other hand, the power source line VDD is set high (3.3 V in FIG. 4B) in the charge read-out period between the time t0 and the time t4 and low (0.2 V in FIG. 4B) in the other period (charge accumulating period) between the time t4 and t5 (t0). Here, the power source line VDD is connected to the drain of the amplifying transistor 113; namely, a depletion-type transistor whose threshold is negative. Hence, the power source line VDD supplies (i) a predetermined voltage during a period when the selection transistor 115 is on, and (ii) a voltage lower than the predetermined voltage during a period when the selection transistor 115 is off. In other words, the power source line VDD is set high only during the period when the row selection signal SEL is set high, the SF circuit operates, and the potential of the FD is detected. The power source line VDD is set low during the period when the row selection signal SEL is set low and the SF circuit is not operating. The low voltage of the power source line VDD may be lower than the voltage on the source of the amplifying transistor 113 when the SF circuit is under the operating state. In other words, during a period when the reset transistor 117 and the selection transistor 115 are on, the voltage lower than the predetermined voltage may be lower than a voltage provided from the amplifying transistor 113 to the column signal line 141. For example, the low voltage may be as low as the GNF level (VSS). Thanks to the driving, no rise in potential due to coupling is observed on the gate of the amplifying transistor 113 even though the source and the drain of the amplifying transistor 113; namely a depletion-type transistor, become conductive. This prevents a dark current from occurring between the time t4 and the time t5. It is noted that the supply of the predetermined voltage and the voltage lower than the predetermined voltage by the power source line VDD is implemented through, for example, a change in a voltage provided from a power source connected to the power source line VDD.

For a pixel 11 in a multi-layer MOS image sensor formed of three transistors and a non-pinned photodiode, a technique to accumulate holes allows the initial potential of a charge accumulating capacitor (accumulation diode) to be set low. This contributes to providing images having fewer dark currents and defects. In the case where, for the amplifying transistor 113 for detecting a low potential and having a low threshold voltage, the pixel 11 performs an SF, no problem will occur. In the case where the pixel 11 does not perform such an operation, however, photoelectric conversion will raise the gate potential of the amplifying transistor 113 and the connection between the drain and the source will be facilitated. Hence, the power supply connected to the drain of the amplifying transistor 113 is electrically connected to the source of the amplifying transistor 113. As a result, the gate potential of the amplifying transistor 113 rises due to coupling caused by the power supply voltage, and so does the potential of the charge accumulating capacitor connected to the gate. The rise in the potential of the charge accumulating capacitor inevitably causes an increase in dark current and defects, leading to deterioration in image quality. In the driving in FIG. 4B, in contrast, pulse driving is performed when the amplifying transistor 113 is not operating as a SF (when the row selection signal SEL is low) in order to drop the voltage of the power source line VDD so as not to raise the gate potential of the amplifying transistor 113. Consequently, the rise in the potential of the charge accumulating capacitor reduces, and the leak of charges at the charge accumulating capacitor decreases.

Embodiment 2

FIG. 9A shows in detail a circuit structure of a multi-layer solid-state imaging device according to Embodiment 2. FIG. 9B shows temporal changes in a row reset signal RESET and a row selection signal SEL provided to the pixels 11, a driving signal LGCELL provided to the gate of a load transistor 130, a potential of the power source line 125 (potential of the drain of the amplifying transistor 113), and potentials of an FD (accumulation diode) and a VDD when pixel signals are read out for one row. It is noted that in FIG. 9B, the period from the time t0 to the time t3 is a charge read-out period for reading out pixel signals to the column signal line 141, and the period from the time t3 to the time t4 is a charge accumulating period for accumulating charges into the photoelectric converting unit 111. In FIG. 9B, A denotes, "An FD potential drops by coupling, and an FD dark current decreases", B denotes, "A change in FD potential in ideal charge accumulation", C denotes, "The gate capacitance of the amplifying transistor does not influence the operation since the SF is operating in the charge read-out period", and D denotes, "The LGCELL drops to 0.0 V, so that the column signal lines enter a floating state, the FD potential drops by coupling, and the FD dark current decreases".

The solid-state imaging device according to Embodiment 2 differs from the one according to Embodiment 1 in that a pixel 11 in the former solid-state imaging device has the selection transistor 115 provided closer to the VDD (the power source line 125)—that is, the selection transistor 115 is provided between the drain of the amplifying transistor 113 and the power source line 125. The solid-state imaging device according to Embodiment 2 further differs from the one according to Embodiment 1 in that the voltage VDD of the power source line 125 is fixed, and the driving signal LGCELL—that is a signal of the source follower circuits connected in common to the column of the pixels 11—is modified from any given fixed voltage to a pulse. Still another difference between the solid-state imaging devices is that the solid-state imaging device according to Embodiment 2 includes the load transistor 130 provided between the column signal line 141 and a fixed potential (ground potential GND).

Only during the period from the time t0 to the time t3 when the amplifying transistor 113 operates as a source follower circuit, the driving signal LGCELL is set to an any given fixed voltage (1.0 V in FIG. 9B). During the period from the time t3 to the time t4, the driving signal LGCELL is set to the GND level (VSS). Here, the amplifying transistor 113 is a depletion-type transistor, and in either period, the node B shown in FIG. 9A (drain of the amplifying transistor 113) is connected with the column signal line 141. Hence, during a period when the selection transistor 115 is off, the load transistor 130 is off and a voltage of the column signal line 141 is lower than a voltage of the drain of the amplifying transistor 113. If the node B and the column signal line 141 are in the floating state, the potential of the gate of the amplifying transistor 113 will vary by coupling since the amplifying transistor 113 is a MOS transistor. Here, the potential of the accumulation diode (FD) is a potential divided between the gate capacitance of the amplifying transistor 113 and the capacitance of the accumulation diode (FD). In FIG. 9B, the gate capacitance of the amplifying transistor 113 and the capacitance of the accumulation diode are the same. Hence, the potential of the accumulation diode is approximately 50% of the variation in gate potential. When the node B is 2.5 V and the column signal line 141 is 1.0 V, the potential of the accumulation diode (FD) drops by 50% of the difference voltage of 1.5 V to 0.75 V. The original potential for the FD of 0.2 V drops to −0.55 V, and the dark current of the FD decreases. Hence, the pulse driving is performed to set the column signal line 141 to the GND level (VSS). Consequently, the pixel circuit on which the selection transistor 115 is provided close to the VDD can achieve an effect similar to the one achieved in Embodiment 1.

Embodiment 3

Figure 10A:
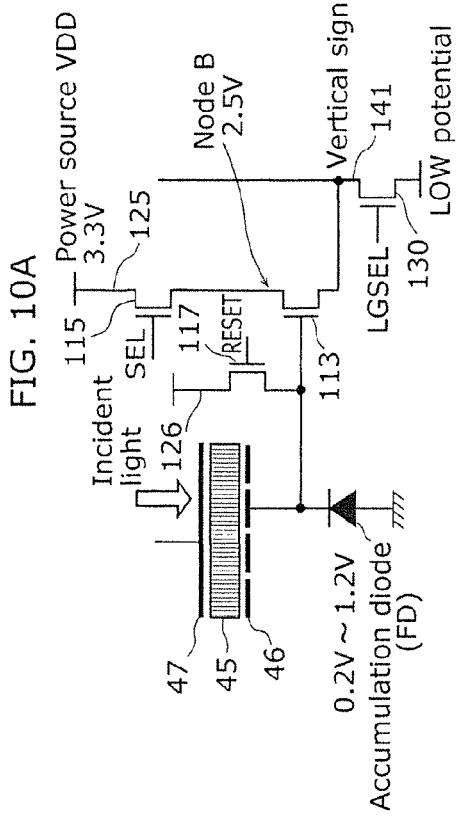
FIG. 10A shows in detail a circuit structure of a solid-state imaging device according to Embodiment 3.
Figure 10B:
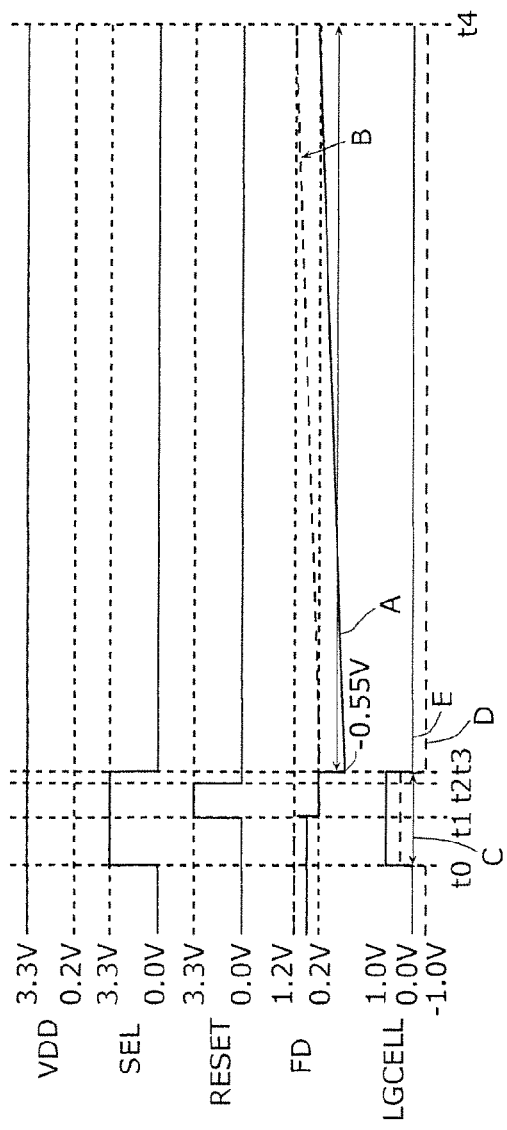
FIG. 10B shows temporal changes in a row reset signal RESET, a row selection signal SEL, a driving signal LGCELL, a potential of a power source line, and a potential of an FD when pixel signals of the solid-state imaging device according to Embodiment 3 are read out for one row.

FIG. 10A shows in detail a circuit structure of a multi-layer solid-state imaging device according to Embodiment 3. FIG. 10B shows temporal changes in a row reset signal RESET and a row selection signal SEL provided to the pixels 11, a driving signal LGCELL provided to the gate of the load transistor 130, a potential of the power source line 125 (potential of the drain of the amplifying transistor 113), and potentials of an FD (accumulation diode) and a VDD, when pixel signals are read out for one row. It is noted that in FIG. 10B, the period from the time t0 to the time t3 is a charge read-out period for reading out pixel signals to the column signal line 141, and the period from the time t3 to the time t4 is a charge accumulating period for accumulating charges into the photoelectric converting unit 111. In FIG. 10B, A denotes, "An FD potential drops by coupling, and the leak at FD decreases", B denotes, "A change in FD potential in ideal charge accumulation", C denotes, "The gate capacitance of the amplifying transistor does not influence the operation since the SF is operating in the charge read-out period", D denotes, "The LOW potential drops to −1.0 V so that the SF obtains a wider dynamic range", and E denotes, "The LGCELL drops to 0.0 V so that the column signal lines enter a floating state, the FD potential drops by coupling, and the FD dark current decreases".

The solid-state imaging device according to Embodiment 3 is developed from the solid-state imaging device according to Embodiment 2, and achieves an improvement in a signal detecting operation. The solid-state imaging device according to Embodiment 3 is the same as the one according to Embodiment 2 in that the load transistor 130 are connected between the column signal line 141 and a fixed potential; however, the former solid-state imaging device differs from the later one in that the fixed potential of the former solid-state imaging device is a LOW potential which is a negative potential instead of a ground potential GND.

A pixel 11 in the solid-state imaging device according to Embodiment 2 has the selection transistor 115 provided close to VDD. Hence, the operation range (dynamic range) of the amplifying transistor 113 becomes narrow. This is because the potential of the node B, provided close to the amplifying transistor 113, drops for a threshold voltage of the selection transistor 115. Hence, the solid-state imaging device according to Embodiment 3 achieves a wider operation range (dynamic range), by shifting a potential of a driving pulse LGCELL for pulse driving to a lower voltage and setting the fixed voltage connected to the load transistor 130 to a negative voltage.

Embodiment 4

Figure 11:
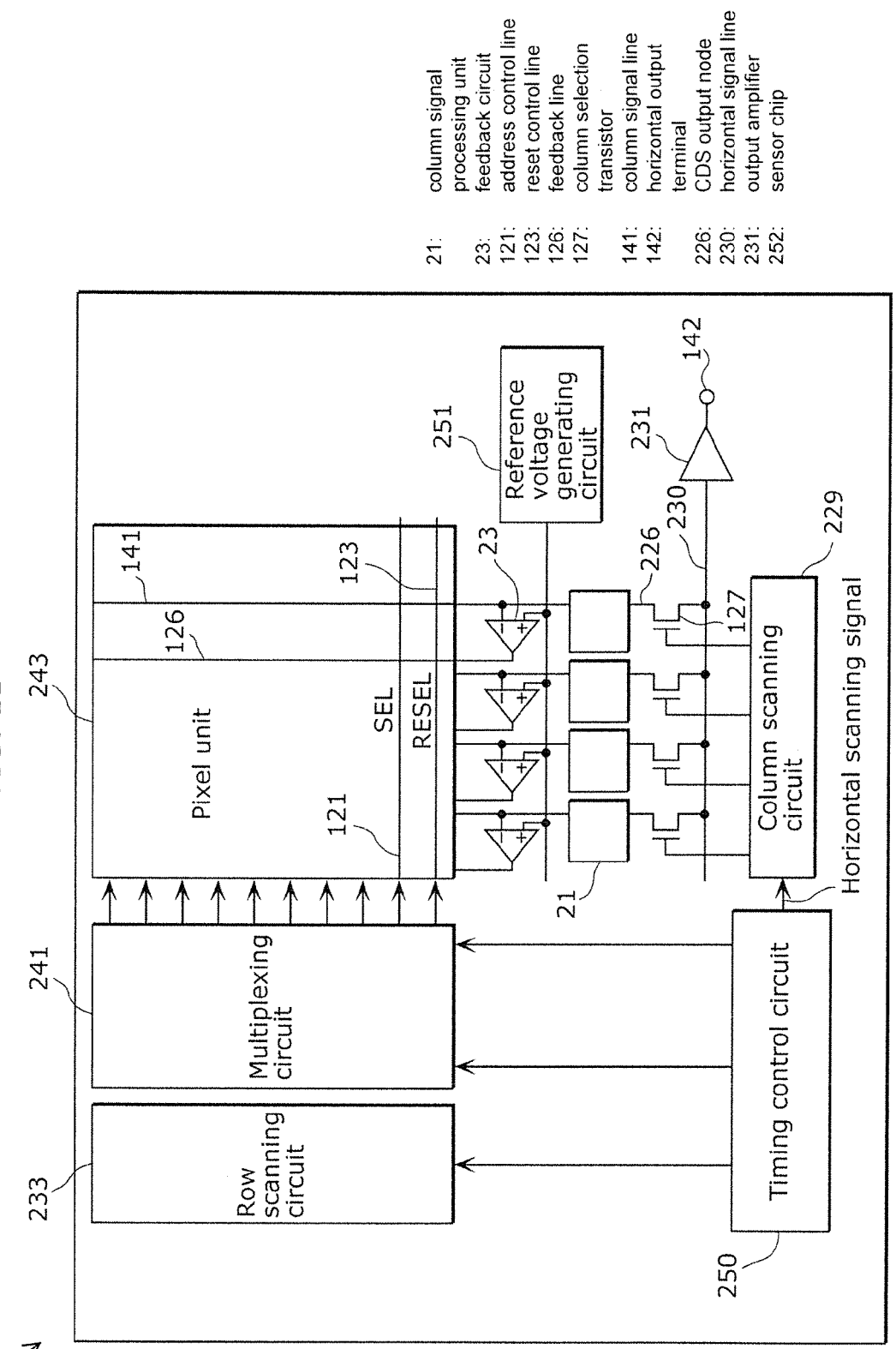
FIG. 11 shows a structure of a chip included in a multilayer solid-state imaging device according to Embodiment 4.
Figure 12:
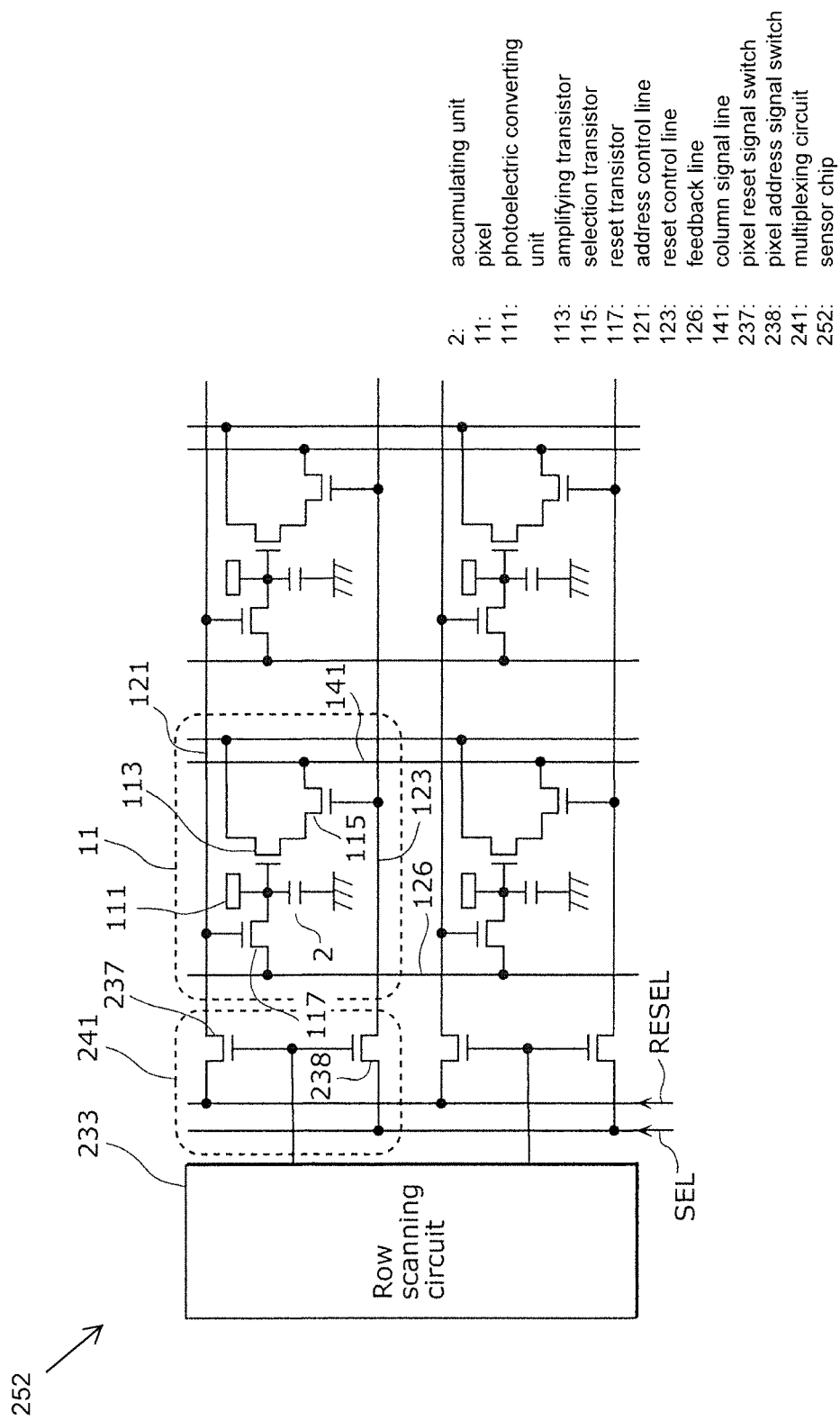
FIG. 12 shows in detail a pixel unit and a peripheral circuit thereof according to Embodiment 4.
Figure 13:
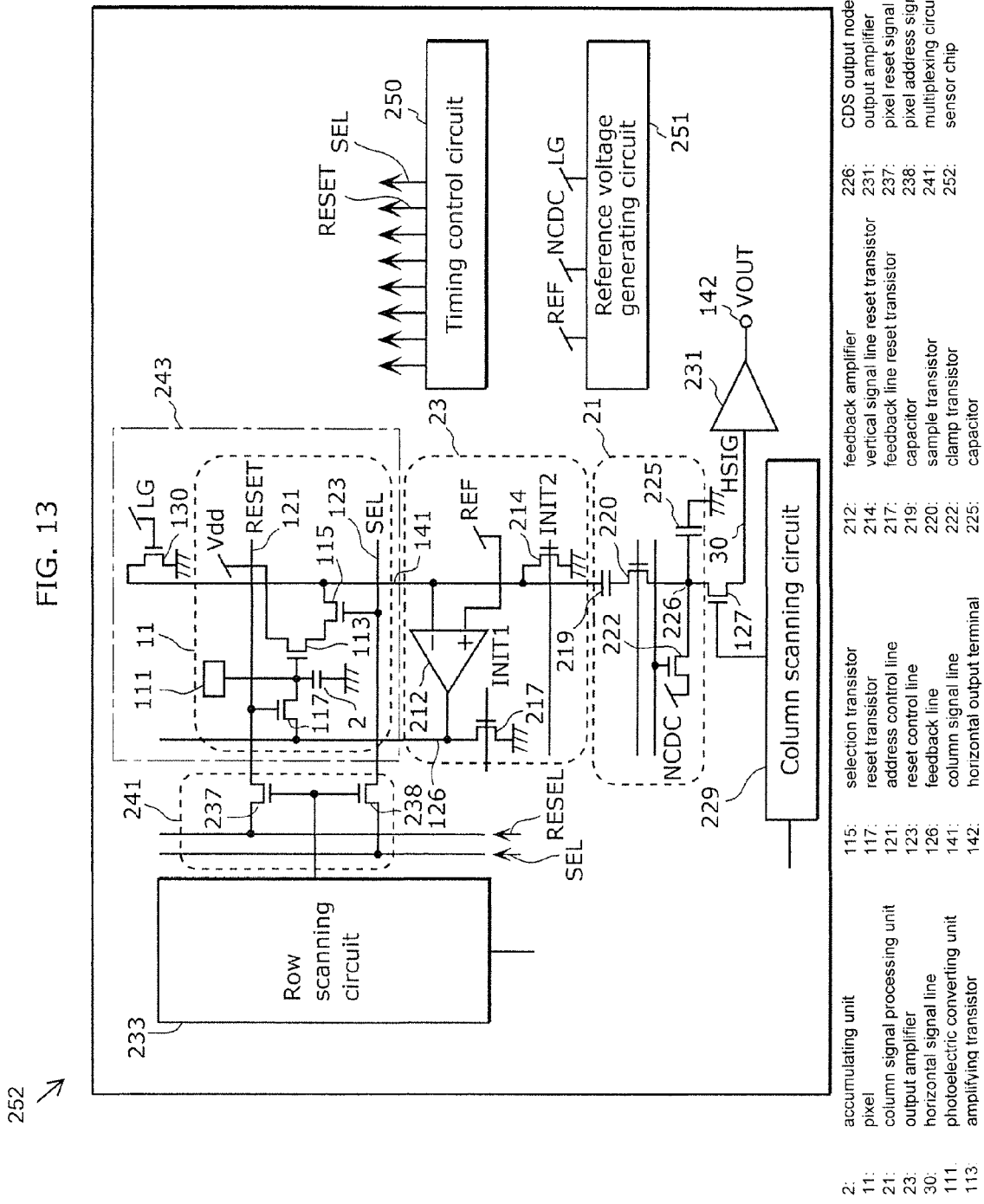
FIG. 13 depicts a circuit diagram showing how the solid-state imaging device according to Embodiment 4 operates.

FIG. 11 shows a structure of a chip included in a multi-layer solid-state imaging device according to Embodiment 4. FIG. 12 shows in detail a pixel unit 243 and a peripheral circuit thereof. FIG. 13 depicts a circuit diagram of the solid-state imaging device according to Embodiment 4.

The solid-state imaging device according to Embodiment 4 differs from the solid-state imaging devices according to Embodiments 1 to 3 in that the former solid-state imaging device reduces a dark current, includes the feedback circuit 23 which is further developed from Embodiments 1 to 3 and capable of reducing thermal noise that develops when an accumulation diode is initialized, and performs a soft reset. Such features allow the solid-state imaging device to generate high-quality images.

A sensor chip 252; namely the solid-state imaging device, includes the address control lines 121, the reset control lines 123, the column signal lines 141, the feedback lines 126, column selection transistors 127, a column scanning circuit (horizontal scanning unit) 229, a horizontal signal line 30, an output amplifier 231, a row scanning circuit (vertical scanning unit) 233, a multiplexing circuit (MUX) 241, a horizontal output terminal (VOUT terminal) 142, a pixel unit 243, the feedback circuit 23, column signal processing units (correlated double sampling circuit or CDS circuit) 21, a timing control circuit 250, and a reference voltage generating circuit 251.

The timing control circuit 250 supplies a vertical scanning signal to the row scanning circuit 233, a row selection signal SEL and a row reset signal RESET to the multiplexing circuit 241, and a horizontal scanning signal to the column scanning circuit 229. The timing control circuit 250 generates the row selection signal SEL and the row reset signal RESET.

The multiplexing circuit 241 includes a pixel reset signal switch 237 and a pixel address signal switch 238, and controls the output of the row selection signal SEL and the row reset signal RESET to the pixel unit 243.

The reference voltage generating circuit 251 supplies a feedback AMP reference signal REF to the feedback circuit 23.

The column signal processing unit 21 includes capacitors 219 and 225, a sample transistor 220, and a clamp transistor 222. Each of the column signal processing unit 21 is provided to a corresponding one of the column signal lines 141. The column signal processing unit 21 outputs from a CDS output node 226 a signal corresponding to a difference between potentials (i) found on a column signal line 141 corresponding to the column signal processing unit 21 and (ii) observed at any given two different times. That is, the difference is between a potential observed in a reset operation (a potential on the column signal line 141 when the reset transistor 117 is on) and another potential observed in a pixel signal outputting operation (a potential on the column signal line 141 when the reset transistor 117 is off).

The feedback circuit 23 includes a feedback amplifier 212 which operates as an inverting amplifier, a vertical signal line reset transistor 214, and a feedback line reset transistor 217. The pixel unit 243 includes the multiple pixels 11 arranged on a semiconductor substrate in a matrix. Each of the columns of the pixels 11 is provided with a corresponding one of the column signal lines 141. In the sensor chip 252, the pixels 11 included in the pixel unit 243 are selected by the row scanning circuit 233 and the multiplexing circuit 241.

Described next is an operation of the solid-state imaging device according to Embodiment 4.

Figure 14:
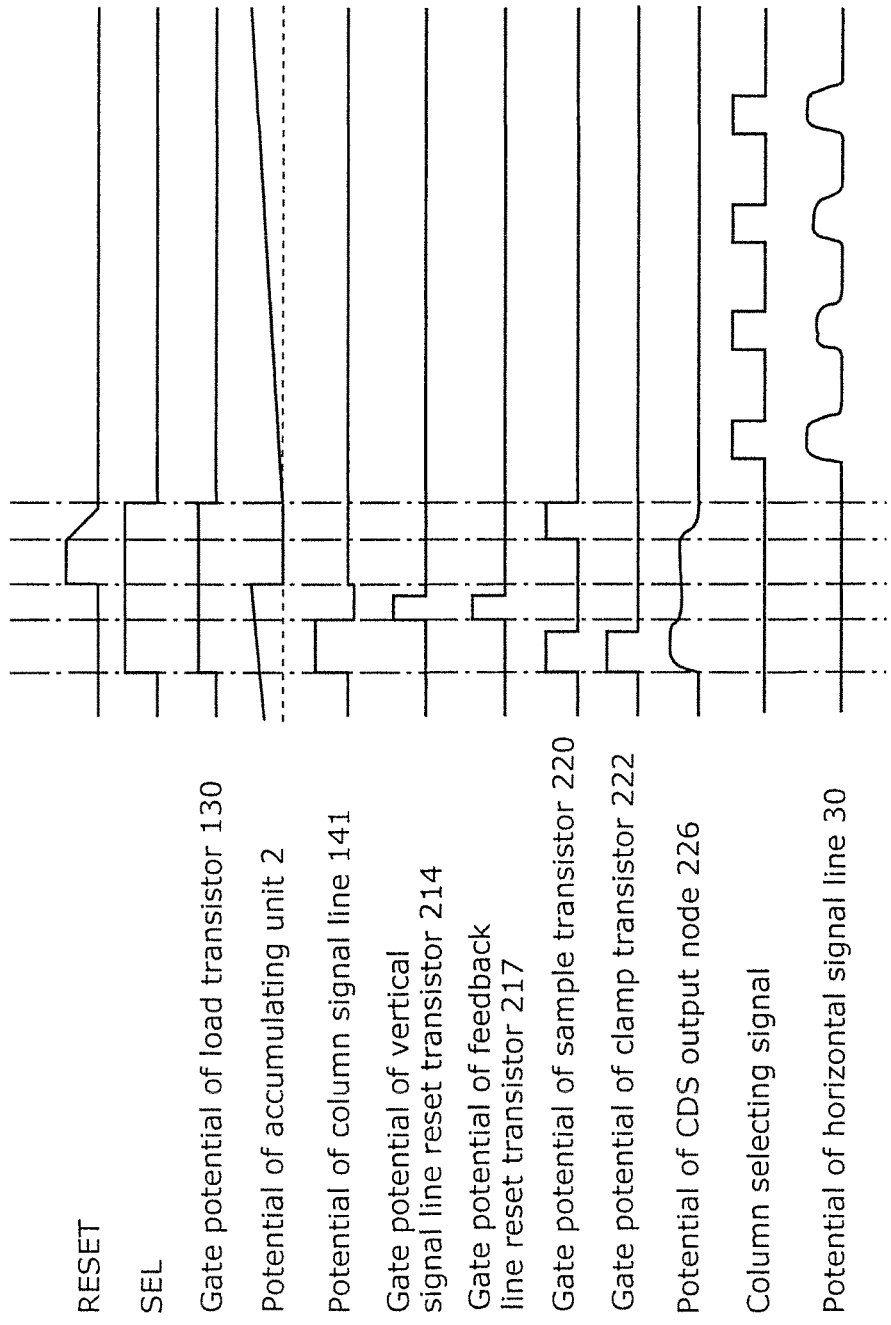
FIG. 14 depicts a timing chart showing how the solid-state imaging device according to Embodiment 4 operates.
Figure 15:
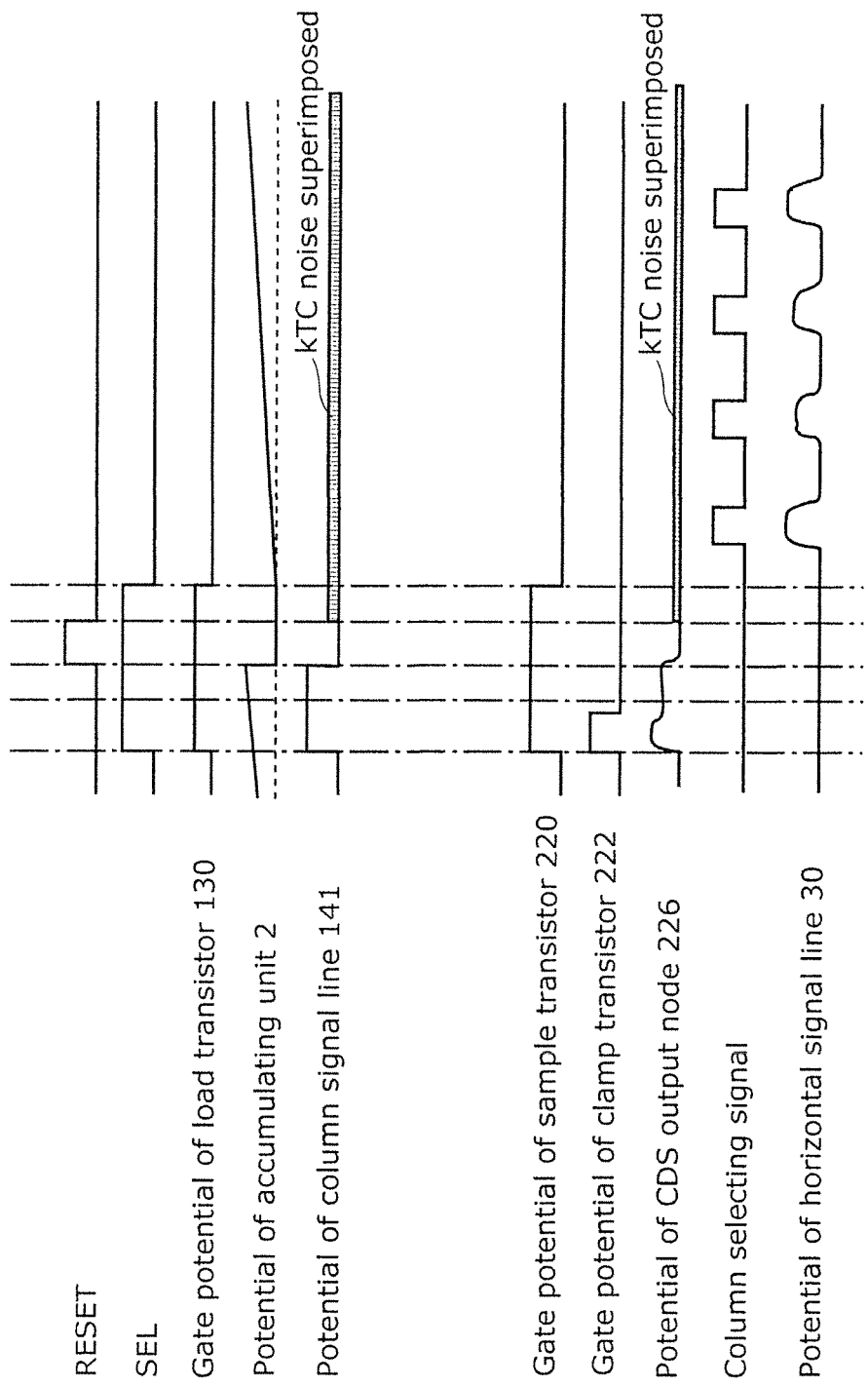
FIG. 15 depicts a timing chart showing how the solid-state imaging device in a comparative example operates.
Figure 16:
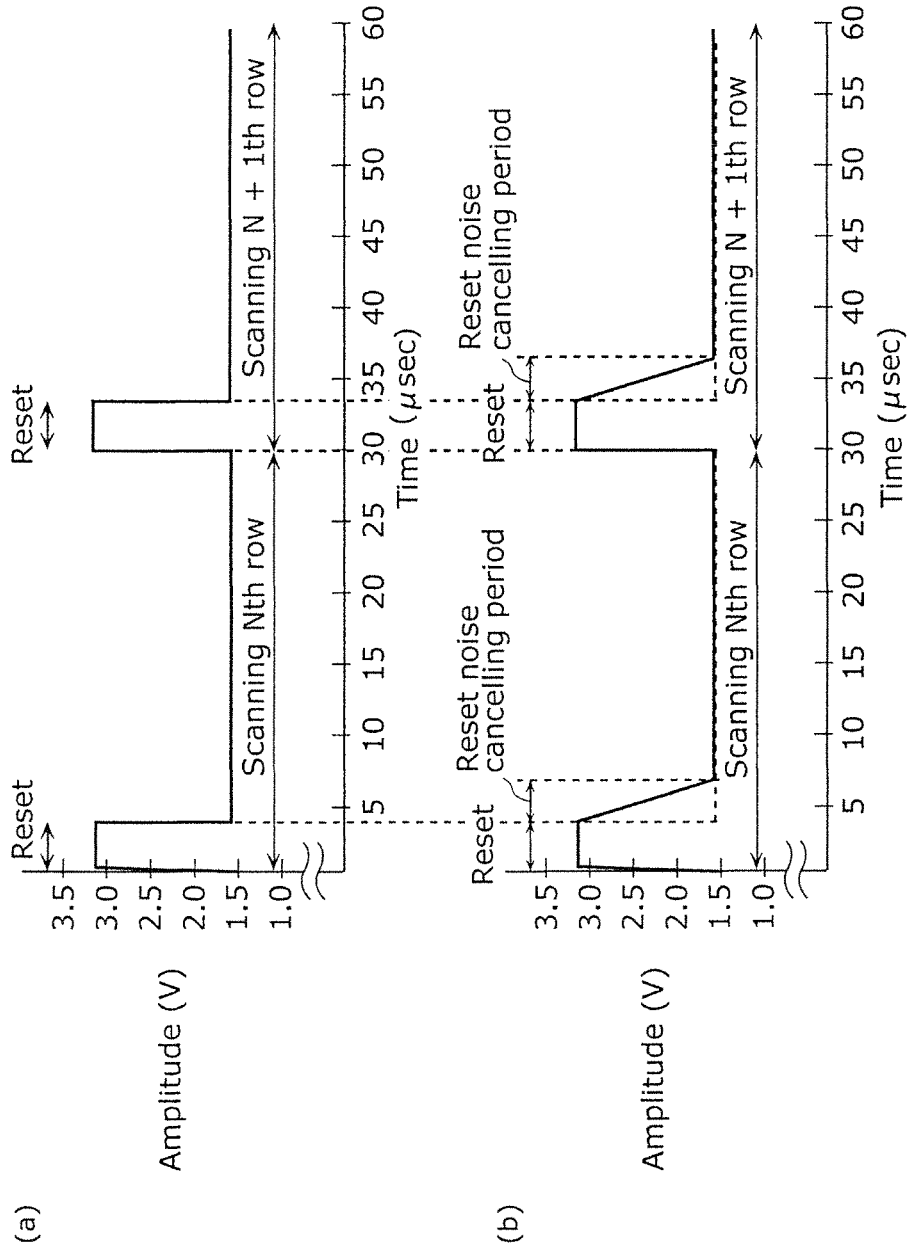
FIG. 16 shows waveforms of reset signals in the solid-state imaging device according to the comparative example and the solid-state imaging device according to Embodiment 4.

FIG. 14 depicts a timing chart showing how the solid-state imaging device according to Embodiment 4 operates. FIG. 15 depicts a timing chart showing how the solid-state imaging device in a comparative example operates. The illustration (a) in FIG. 16 shows a waveform of a reset signal in the solid-state imaging device in the comparative example. The illustration (b) in FIG. 16 shows a waveform of a reset signal in the solid-state imaging device according to Embodiment 4.

In the solid-state imaging device according to Embodiment 4, the photoelectric converting unit 111 converts light into an electric signal S and each of signals S is accumulated into an accumulating unit (accumulation diode) 2. Here, when the selection transistor 115 turns on, the electric signal S receives impedance conversion by a source follower circuit including the amplifying transistor 113 and the load transistor 130, and provided to the column signal processing unit 21 via the column signal line 141. The electric signal S is then once sampled by and held in the column signal processing unit 21.

Next, when the row reset signal RESET enters a pixel 11 via the reset control line 123 and the reset transistor 117 turns on, each of the electric signals S, which have been accumulated in the accumulating unit 2, is reset.

When the electric signal reset in the accumulating unit 2 is denoted N, a pixel signal N which includes random noise is inverted and amplified, and then provided to the feedback line 126 instead of a constant voltage. Consequently, the thermal noise of the accumulating unit 2 can be canceled.

In the case where the row reset signal RESET is applied in the form of a steep square wave as shown in the illustration (a) in FIG. 16, however, thermal noise develops in the accumulating unit 2 as shown in FIG. 15. In other words, instead of being reset by the row reset signal RESET at the signal level of the feedback line 126, the accumulating unit 2 has the thermal noise additionally superimposed. This causes random noise. Here, with the random noise superimposed, the electric signal N enters the column signal processing unit 21 through the same path as the electric signal S has entered the column signal processing unit 21, and sampled by and held in the column signal processing unit 21.

In contrast, the row reset signal RESET is to be formed in a waveform having a gradual slope on the trailing edge of the reset pulse as shown in the illustration (b) in FIG. 16, instead of a steep square wave, and the row reset signal RESET having the waveform with gradual slope is used for the solid-state imaging device to perform a soft reset operation. Hence, thermal noise itself is produced less as shown in FIG. 14. Consequently, the random noise of the electric signal N can be significantly reduced. In addition, as shown in the illustration (b) in FIG. 16, the trailing edge of the reset pulse in the soft reset operation is made falling—that is tapered—through a period in which the development of the thermal noise is sufficiently reduced; for example, a period of several hundred seconds to several tens of mu seconds. Consequently, the thermal noise can be significantly reduced, which assures the image quality to improve.

For example, the time period of a tapered wave between the start of the change (fall) of the trailing edge on the reset pulse and the turn-off of the reset transistor 117—that is a time period for the soft reset of the reset transistor 117—is ten times longer than or equal to, for example as long as 100 times, a time period, for example some ten n seconds, between the start of the change of the trailing edge of a row selecting pulse (a pulse for controlling on and off of the selection transistor 115) included in the row selection signal SEL supplied to the gate of the selection transistor 115 and the turn-off of the selection transistor 115.

Next, the column signal processing unit 21 obtains the difference between the electric signal S and the electric signal N. The difference is outputted to the CDS output node 226 and used as a pixel signal P. Here, as shown in FIG. 15, the pixel signal P is inevitably influenced by a component of the random noise.

Finally, the column selection transistor 127 is turned on by a column selecting signal from the column scanning circuit 229, and the pixel signal P is read out to the horizontal signal line 230. The pixel signal P is then amplified by the output amplifier 231 and provided outside from the horizontal output terminal 142.

As described above, the solid-state imaging device according to Embodiment 5 simultaneously carries out two operations; namely the soft reset operation and the feedback operation. Such a feature makes it possible to significantly reduce the random noise of the electric signal N, and decrease thermal noise developed in the reset transistor 117 in a pixel 11, which contributes to improvement in image quality. The resulting multi-layer solid-state imaging device can reduce a dark current and thermal noise to be developed in an accumulation diode.

Embodiment 5

Figure 17:
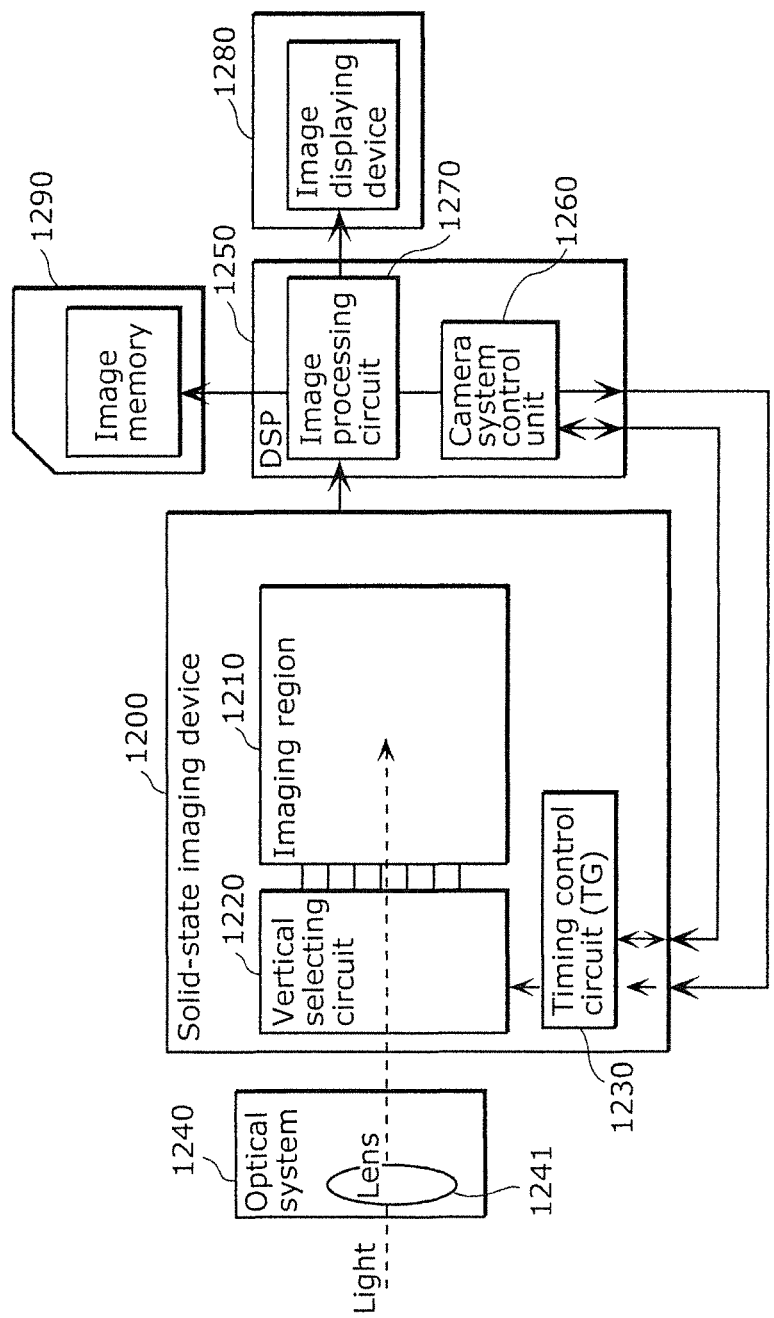
FIG. 17 shows an overall structure of an imaging apparatus according to Embodiment 5.

FIG. 17 shows an overall structure of an imaging apparatus (camera system) according to Embodiment 5.

The imaging apparatus according to Embodiment 5 includes the following major constituent features: a solid-state imaging device 1200; an optical system 1240; a digital signal processor (DSP) 1250; an image displaying device 1280 such as a liquid crystal display; and an image memory 1290.

The optical system 1240 includes a lens 1241 which collects light from an object to form an image on an array of pixels in the solid-state imaging device 1200.

The solid-state imaging device 1200 is the solid-state imaging devices according to Embodiments 1 to 4. The solid-state imaging device 1200 includes: an imaging region (pixel unit) 1210 having pixels including a MOS transistor and a photosensitive device such as a photodiode and arranged in a matrix; a vertical selecting circuit (row scanning unit) 1220 which selects unit cells in the imaging region 1210 for each row, and controls the resetting and signal reading of the unit cells; and a timing control circuit 1230 which supplies a driving pulse to the vertical selecting circuit 1220.

The DSP 1250 includes a camera system control unit 1260 and an image processing circuit 1270.

Upon receiving a digital pixel signal provided from the solid-state imaging device 1200, the image processing circuit 1270 executes processing necessary for camera signals, such as gamma correction, color interpolation, space interpolation, and automatic white balance. Moreover, the image processing circuit 1270 compresses data into a compression format such as JPEG, stores data in the image memory 1290, and processes display signals for the image displaying device 1280.

The camera system control unit 1260 is, for example, a micro computer for controlling the optical system 1240, the solid-state imaging device 1200, and the image processing circuit 1270 based on various setting designated by a user I/F (now shown), and integrating overall operations of the imaging apparatus. For example, the user I/F receives a real-time instruction, such as a change in zoom magnification and an operation of a release button, as an input. The camera system control unit 1260 then changes the zoom magnification of the lens 1241, and control the traveling speed of a curtain of the shutter and the reset scanning of the solid-state imaging device 1200.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Industrial Applicability

The present disclosure is applicable to solid-state imaging devices. In particular, the present disclosure is applicable to a highly sensitive camera with a large saturating amount and fewer dark currents. The camera is such as a high-definition-type digital still camera, a digital camcorder, a camera for a cellular phone, an automotive camera, a street camera, a security camera, and a medical camera.

The invention claimed is:

1. A solid-state imaging device comprising:
a semiconductor substrate;
pixels arranged on the semiconductor substrate in a matrix; and
vertical signal lines each formed for a corresponding one of columns of the pixels, wherein:
each of the pixels includes an amplifying transistor, a selection transistor, a reset transistor, and a photoelectric converting unit,
the photoelectric converting unit includes a photoelectric converting film formed above the semiconductor substrate, a transparent electrode formed above the photoelectric converting film, a pixel electrode formed below the photoelectric converting film, and an accumulation diode which accumulates signal charges to be obtained by the photoelectric converting film and is connected to the pixel electrode,
the pixel electrode and the accumulation diode are connected to a gate of the amplifying transistor, the amplifying transistor has a source connected to the vertical signal line and a drain connected to a power source line, the reset transistor has a source connected to the pixel electrode, the selection transistor is provided one of (i) between the source of the amplifying transistor and the vertical signal line and (ii) between the drain of the amplifying transistor and the power source line, a threshold voltage of the amplifying transistor is lower than a voltage of the accumulation diode, and the power source line supplies (i) a predetermined voltage during a period when the selection transistor is on, and (ii) a voltage lower than the predetermined voltage during a period when the selection transistor is off.

2. The solid-state imaging device according to claim 1, wherein, during a period when the reset transistor and the selection transistor are on, the voltage lower than the predetermined voltage is lower than a voltage provided from the amplifying transistor to the vertical signal line.

3. The solid-state imaging device according to claim 1, further comprising a load transistor provided between the vertical signal line and a fixed potential, wherein during a period when the selection transistor is off, the load transistor is off and a voltage of the vertical signal line is lower than a voltage of the drain of the amplifying transistor.

4. The solid-state imaging device according to claim 3, wherein the fixed potential is a negative potential.

5. The solid-state imaging device according to claim 1, wherein the reset transistor has a drain connected to the vertical signal line via an inverting amplifier.

6. A camera system comprising the solid-state imaging device according to claim 1.

7. A solid-state imaging device comprising:

a semiconductor substrate;

pixels arranged on the semiconductor substrate in a matrix; and vertical signal lines each formed for a corresponding one of columns of the pixels, wherein: each of the pixels includes an amplifying transistor, a selection transistor, a reset transistor, and a photoelectric converting unit, the photoelectric converting unit includes a photoelectric converting film formed above the semiconductor substrate, a transparent electrode formed above the photoelectric converting film, a pixel electrode formed below the photoelectric converting film, and an accumulation diode which accumulates signal charges to be obtained by the photoelectric converting film and is connected to the pixel electrode, the pixel electrode and the accumulation diode are connected to a gate of the amplifying transistor, the amplifying transistor has a source connected to the vertical signal line and a drain connected to a power source line, the reset transistor has a source connected to the pixel electrode, the selection transistor is provided one of (i) between the source of the amplifying transistor and the vertical signal line and (ii) between the drain of the amplifying transistor and the power source line, a threshold voltage of the amplifying transistor is lower than a voltage of the accumulation diode, the accumulation diode comprises a n-type diffusion layer, the photoelectric converting film converts incident light into electron-hole pairs as the signal charges, and the holes of the electron-hole pairs are transferred to and accumulated in the n-type diffusion layer.

8. The solid-state imaging device according to claim 7, wherein the power source line supplies (i) a predetermined voltage during a period when the selection transistor is on, and (ii) a voltage lower than the predetermined voltage during a period when the selection transistor is off.

9. The solid-state imaging device according to claim 8, wherein, during a period when the reset transistor and the selection transistor are on, the voltage lower than the predetermined voltage is lower than a voltage provided from the amplifying transistor to the vertical signal line.

10. The solid-state imaging device according to claim 7, wherein the reset transistor has a drain connected to the vertical signal line via an inverting amplifier.

11. A camera system comprising the solid-state imaging device according to claim 7.

* * * * *